(12) United States Patent
Helvajian et al.

(10) Patent No.: US 10,173,262 B2
(45) Date of Patent: Jan. 8, 2019

(54) SYSTEMS AND METHODS FOR MONITORING TEMPERATURE USING ACOUSTIC WAVES DURING PROCESSING OF A MATERIAL

(71) Applicant: The Aerospace Corporation, El Segundo, CA (US)

(72) Inventors: Henry Helvajian, Pasadena, CA (US); Anthony J. Manzo, Palmdale, CA (US)

(73) Assignee: The Aerospace Corporation, El Segundo, CA (US)

( * ) Notice: Subject to any disclaimer, the term of this patent is extended or adjusted under 35 U.S.C. 154(b) by 434 days.

(21) Appl. No.: 15/016,042

(22) Filed: Feb. 4, 2016

(65) Prior Publication Data

US 2017/0227408 A1    Aug. 10, 2017

(51) Int. Cl.
| | |
|---|---|
| G01K 11/00 | (2006.01) |
| G01N 25/00 | (2006.01) |
| B22F 3/105 | (2006.01) |
| G01K 11/24 | (2006.01) |
| G06F 17/50 | (2006.01) |
| B29C 64/153 | (2017.01) |

(Continued)

(52) U.S. Cl.
CPC .......... *B22F 3/1055* (2013.01); *B29C 64/153* (2017.08); *B29C 64/393* (2017.08); *G01K 11/24* (2013.01); *G06F 17/50* (2013.01); *B22F 2003/1057* (2013.01); *B22F 2999/00* (2013.01); *B33Y 50/02* (2014.12); *B33Y 80/00* (2014.12)

(58) Field of Classification Search
USPC ............................................... 374/1, 117, 43
See application file for complete search history.

(56) References Cited

U.S. PATENT DOCUMENTS

| 4,249,418 A | 2/1981 | Ebata |
|---|---|---|
| 4,399,441 A | 8/1983 | Vaughan et al. |

(Continued)

FOREIGN PATENT DOCUMENTS

| DE | 4205832 A1 | 9/1993 |
|---|---|---|
| JP | H09199426 A | 7/1997 |

OTHER PUBLICATIONS

Bachari et al., "Structural and Optical Properties of Sputtered ZnO Films," Thin Solid Films 348:165-172 (1999).

(Continued)

*Primary Examiner* — Mirellys Jagan
(74) *Attorney, Agent, or Firm* — Jones Day

(57) ABSTRACT

Under one aspect, a method of processing a material includes heating a region of the material with a first energy source; exciting an acoustic wave in the material; and transmitting the acoustic wave through the heated region, the heated region changing at least one property of the acoustic wave. The method also can include detecting the change in at least one property of the acoustic wave; characterizing a temperature of the material in the heated region based on the detected change in at least one property of the acoustic wave; and comparing the characterized temperature of the material in the heated region to a threshold. The method further can include, based on the characterized temperature of the material in the heated region being less than the threshold or being above the threshold for an insufficient amount of time, modifying a property of the heated region with a second energy source.

12 Claims, 17 Drawing Sheets

(51) Int. Cl.
    *B29C 64/393* (2017.01)
    *B33Y 80/00* (2015.01)
    *B33Y 50/02* (2015.01)

(56) References Cited

U.S. PATENT DOCUMENTS

| | | | |
|---|---|---|---|
| 4,579,463 A * | 4/1986 | Rosencwaig | G01N 21/55 |
| | | | 356/432 |
| 4,633,715 A | 1/1987 | Monchalin | |
| 4,810,100 A * | 3/1989 | Shavit | G01K 11/24 |
| | | | 165/270 |
| 4,966,459 A | 10/1990 | Monchalin | |
| 5,080,491 A | 1/1992 | Monchalin et al. | |
| 5,136,172 A | 8/1992 | Nakata et al. | |
| 5,208,643 A | 5/1993 | Fair | |
| 5,286,313 A | 2/1994 | Schultz et al. | |
| 5,410,405 A | 4/1995 | Schultz et al. | |
| 5,446,452 A | 8/1995 | Litton | |
| 5,569,502 A | 10/1996 | Koinuma et al. | |
| 5,721,615 A | 2/1998 | McBride et al. | |
| 5,724,138 A | 3/1998 | Reich et al. | |
| 5,804,727 A | 9/1998 | Lu et al. | |
| 6,078,397 A | 6/2000 | Monchalin et al. | |
| 6,256,100 B1 | 7/2001 | Banet et al. | |
| 6,628,404 B1 | 9/2003 | Kelley et al. | |
| 6,795,198 B1 | 9/2004 | Fuchs et al. | |
| 7,434,989 B2 | 10/2008 | Solie | |
| 7,526,357 B2 | 4/2009 | Livingston et al. | |
| 7,541,103 B2 | 6/2009 | Leu | |
| 7,884,047 B2 | 2/2011 | Labrousse et al. | |
| 9,303,309 B2 | 4/2016 | Helvajian | |
| 9,945,032 B2 | 4/2018 | Helvajian | |
| 2002/0055012 A1 | 5/2002 | Chou et al. | |
| 2003/0094032 A1 | 5/2003 | Baklanov et al. | |
| 2003/0150272 A1 | 8/2003 | Janik | |
| 2007/0131871 A1 | 6/2007 | Chang et al. | |
| 2008/0072674 A1 | 3/2008 | Ume et al. | |
| 2009/0200894 A1 | 8/2009 | Kando et al. | |
| 2010/0089615 A1 | 4/2010 | Kuchiyama et al. | |
| 2010/0102280 A1 | 4/2010 | Ford et al. | |
| 2010/0154549 A1 | 6/2010 | Fomitchov | |
| 2010/0215985 A1 | 8/2010 | Kitano | |
| 2011/0064943 A1 | 3/2011 | Wang | |
| 2011/0122727 A1 | 5/2011 | Gleitman et al. | |
| 2011/0123776 A1 | 5/2011 | Shin et al. | |
| 2011/0166797 A1 * | 7/2011 | Ellson | B01L 3/0268 |
| | | | 702/27 |
| 2011/0314921 A1 | 12/2011 | Tsujita | |
| 2012/0070612 A1 | 3/2012 | Lee et al. | |
| 2014/0199550 A1 | 7/2014 | Helvajian | |
| 2014/0227477 A1 | 8/2014 | Cola et al. | |
| 2016/0182009 A1 * | 6/2016 | Bhattacharjee | H01L 41/047 |
| | | | 310/313 B |
| 2016/0208383 A1 | 7/2016 | Helvajian | |
| 2017/0227408 A1 | 8/2017 | Helvajian et al. | |
| 2018/0043473 A1 | 2/2018 | Helvajian et al. | |

OTHER PUBLICATIONS

Bao et al., "Transport Powder and Liquid Samples by Surface Acoustic Waves," Proc. of SPIE 7:72910M through 1-72910M-7 (2009).
Cammack, R. et al., "Oxford Dictionary of Biochemistry and Molecular Biology—Adsorption," 2006, Oxford University Press, 2nd Ed., pp. 20-21.
Cheeke, Fundamentals and Applications of Ultrasonic Waves, Chapters 8 and 10, CRC Press LLC, Boca Raton, Florida, 54 pages (2002).
Clark, J. "Intermolecular Bonding—Van der Waals Forces," Sep. 2012, Retrieved from the Internet: URL: http:www.chemguide.co.uk/atoms/bonding/vdw.html, retrieved on Jul. 28, 2015, pp. 1-8.
Cosenza et al., "Generation of Narrowband Antisymmetric Lamb Waves Using a Formed Laser Source in the Ablative Regime," IEEE Trans. Ultrason. Ferroelectr. Freq. Control 54(1):147-156 (2007).
Daintith, J. et al., "Dictionary of Science—Hydrogen Bond," 2010, Oxford University Press, 6th Ed., pp. 404-405.
Greer et al., "Nanoscale gold pillars strengthened through dislocation starvation," Phys. Rev. B 73:245410-1 through 245410-6 (2006).
Hazan et al., "Effective Prevention of Microbial Biofilm Formation on Medical Devices by Low-Energy Surface Acoustic Waves," Antimicrob. Agents Chemother. 50(12):4144-4152 (2006).
Hurley et al., "Surface Acoustic Wave Methods to Determine the Anisotropic Elastic Properties of Thin Films," Meas. Sci. Technol. 12:1486-1494 (2001).
Kaplan, S.M., "Electrical and Electronics Engineering Dictionary," pp. 81-82 (2004).
Kenderian et al., "Narrow band laser-generated surface acoustic waves using a formed source in the ablative regime," J. Acoust. Soc. Am. 113(1):261-266 (2003).
Koyama et al., "Noncontact ultrasonic transportation of small objects in a circular trajectory in air by flexural vibrations of a circular disc," IEEE Trans. Ultrason. Ferroelectr. Freq. Control. 57(6):1434-1442 (2010).
Kruth et al., "Selective laser melting of iron-based powder," J. Mat. Proc. Tech. 149:616-622 (2004).
Ma et al., "Fast diffusion of water nanodroplets on graphene," Nat. Mater. 15(1):66-71 (2016) (Epub Oct. 19, 2015).
Mavrikakis et al., "Effect of Strain on the Reactivity of Metal Surfaces," Phys. Rev. Lett. 81(13):2819-2822 (1998).
Mckeen, L.W., "Effect of Temperature and Other Factors on Plastics and Elastomers," 2008, William Andrew Publishing/Plastics Design Library, 2nd Ed., pp. 1.
Ni et al., "Effect of Pretreatment on PET Films and its Application for Flexible Amorphous Silicon Solar Cells," IEEE pp. 000293-000296 (2009).
Pedersen et al., "Surface Plasmon Resonance Spectroscopy of Gold Nanoparticle-Coated Substrates," Defence R&D Canada-Suffield, Technical Report (2005).
Pettenkofer et al., "Morphology of the Si/Zno Interface," FVS Workshop pp. 22-29 (2002).
Popa et al., "Active acoustic metamaterials reconfigurable in real time," Phys. Rev. B 91:220303-1 through 220303-5 (2015).
Ruffino et al., "Self-organization of gold nanoclusters on hexagonal SiC and SiO2 surfaces," J. Appl. Phys. 101:064306-1 through 064306-7 (2007).
Scruby et al., "The Launching of Rayleigh Waves from Surface Point Sources," Rayleigh-Wave Theory and Application pp. 102-109 (1985).
Seminario et al., "Clustering Effects on Discontinuous Gold Film NanoCells," J. Nanosci. Nanotech. 4(7):1-11 (2004).
Takahashi et al., "New Thin Film Fabrication Technique Using a Substrate Excited by SAW," IEEE Transactions on Magnetics 26(5):1453-1455 (1990).
The American Heritage Dictionary, "Bandwidth," 2011 (1 page).
Valiveti et al., "Influence of Thermal Annealing and Ion Irradiation on Zinc Silicate Phases in Nanocomposite ZnO—SiOx Thin Films," Appl. Surf. Sci. 317:1075-1079 (2014).
Zhu et al., "Temperature and Strain-Rate Dependence of Surface Dislocation Nucleation," Phys. Rev. Lett. 100(2):025502-1 through 025502-4 (2008) (Epub Jan. 15, 2008).
United States Patent and Trademark Office, Final Office Action for U.S. Appl. No. 13/739,879, dated Aug. 11, 2015 (32 pages).
United States Patent and Trademark Office, Non-Final Office Action for U.S. Appl. No. 13/739,879, dated Feb. 11, 2015 (28 pages).
United States Patent and Trademark Office, Notice of Allowance for U.S. Appl. No. 13/739,879, dated Dec. 29, 2015 (14 pages)
United States Patent and Trademark Office Non-Final Office Action for U.S. Appl. No. 15/237,408, dated Mar. 23, 2018 (12 pages).
United States Patent and Trademark Office Final Office Action for U.S. Appl. No. 15/053,878, dated Jul. 27, 2017 (10 pages).
United States Patent and Trademark Office Non-Final Office Action for U.S. Appl. No. 15/053,878, dated Jan. 23, 2017 (11 pages).
Ahn et al., "Representation of surface roughness in fused deposition modeling," J. Mater. Process. Technol. 209:5593-5600 (2009).

(56) References Cited

OTHER PUBLICATIONS

Van Bael et al., "Micro-CT-based improvement of geometrical and mechanical controllability of selective laser melted Ti6AI4V porous structures," Mater. Sci. Eng., A 528:7423-7431 (2011).
Bhatia, "Scattering of High-Frequency Sound Waves in Polycrystalline Materials," J. Acoust. Soc. Am. 31(1):16-23 (1959).
Briggs, "Acoustic microscopy—a summary," Rep. Prog. Phys. 55:851-909 (1992).
Christman, D. R., et al. "Measurements of dynamic properties of materials vol. III: 6061-T6 aluminum." DNA Report, DASA 2501-3, AD735966 (1971).
Dewhurst et al., "Optical emote measurement of ultrasound," Meas. Sci. Technol. 10:R139-R168 (1999).
Doubenskaia et al., "Comprehensive Optical Monitoring of Selective Laser Melting," JLMN 7(3):236-243 (2012).
Elhadj, S, Matthews, M J, & Yang, S T. (2012). Combined infrared thermal imaging and laser heating for the study of materials thermophysical and processing properties at high temperatures. Critical Reviews in Solid State and Materials Sciences, vol. 39, No. 3, Mar. 28, 2014, pp. 175-196. Retrieved from http://www.osti.gov/scitech/servlets/purl/1132002.
Frazier, "Metal Additive Manufacturing: A Review," JMEPEG 23:1917-1928 (2014).
Chryssolouris, G. (1994). Sensors in laser machining. CIRP Annals-Manufacturing Technology, 43(2), 513-519.
Gu et al., "Laser additive manufacturing of metallic components: materials, processes and mechanisms," International Materials Reviews 57(3):133-164 (2012).
Hariharan, Handbook of Optics vol. II (Michael Bass et al., Eds.; McGraw-Hill, Inc., New York), Chapter 21 Interferometers, Division of Applied Physics, CSIRO, Sydney, Australia. pp. 21.1-21.28 (1995).
Herderick, "Progress in Additive Manufacturing," JOM 67(3):580-581 (2015).
Hess, "Surface Acoustic Waves in Materials Science," Phys. Today 42-47 (2002).
Hubert et al., "Contactless ultrasonic device to measure surface acoustic wave velocities versus temperature," Rev. Sci. Instrum. 78:024901 (2007).
Kino, Gordon S. Acoustic waves: devices, imaging, and analog signal processing. vol. 107. Englewood Cliffs, NJ: Prentice-Hall, 1987.
Leong et al., "Ultrasonic Separation of Particulate Fluids in Small and Large Scale Systems: A Review," Ind. Eng. Chem. Res. 52:16555-16576 (2013).
Manzo et al., "Application of a laser heterodyne technique to characterize surface acoustic waves generated via a pulsed laser excitation," Proc. of SPIE vol. 8967 (7 pages) 2014.
Manzo et al., "Demonstration of enhanced surface mobility of adsorbate cluster species by surface acoustic wave excitation induced by a pulsed laser," Proc. of SPIE vol. 8969 (8 pages) 2014.
Mireles et al., "Closed-loop automatic feedback control in electron beam melting," Int. J. Adv. Manuf. Technol. 78:1193-1199 (2015).
Monchalin, "Optical Detection of Ultrasound," IEEE T. Ultrason. Ferr. UFFC-33(5):485-499 (1986).
Nadal et al., "Continuous model for the shear modulus as a function of pressure and temperature up to the melting point: Analysis and ultrasonic validation," J. Appl. Phys. 93(5):2472-2470 (2003).
Ogi et al, "Ultrasonic attenuation and grain-size evaluation using electromagnetic acoustic resonance," J. Acoust. Soc. Am. 98(1):458-464 (1995).
Pandey et al., "Improvement of surface finish by staircase machining in fused deposition modeling," J. Mater. Process. Technol. 132:323-331 (2003).
Papadakis, "Revised Grain-Scattering Formulas and Tables," J. Acoust. Soc. Am. 37(4):703-710 (1965).
Pyka et al., "Surface Roughness and Morphology Customization of Additive Manufactured Open Porous Ti6A14V Structures," Materials 6:4737-4757 (2013).
Sajeesh et al., "Particle separation and sorting in microfluidic devices: a review," Microfluid Nanofluid 17:1-52 (2014).
Strano et al., "Surface roughness analysis, modelling and prediction in selective laser melting," J. Mater. Process. Technol. 213:589-597 (2013).
Tokiy et al., "Temperature Dependence of Elastic Moduli of Submicrocrystalline Copper," Phys. Solid State 56(5):1002-1005 (2014).
Varshni, "Temperature Dependence of the Elastic Constants," Phys. Rev. B 2(10):3952-3958 (1970).
Xuan et al., "Particle focusing in microfluidic devices," Microfluid Nanofluid 6:1-16 (2010).
Yadroitsev et al., "Surface Morphology in Selective Laser Melting of Metal Powders," Physics Procedia 12:264-270(2011).
Cerniglia et al., "Inspection of additive-manufactured layered components," Ultrasonics. 2015 62:292-298 (2015).

\* cited by examiner

SYSTEMS AND METHODS FOR MONITORING TEMPERATURE USING ACOUSTIC WAVES DURING PROCESSING OF A MATERIAL

STATEMENT OF GOVERNMENT INTEREST

This invention was made with government support under Contract FA8802-14-C-0001 awarded by the Department of the Air Force. The government has certain rights in the invention.

FIELD

This application relates to processing of materials.

BACKGROUND

Additive manufacturing (AM) is a serial material fabrication approach that implements an energy source, such as a laser or electron-beam, to melt, fuse, and sinter or cross-link a precursor material which can be delivered, e.g., in powder, droplet form or as a thin wire. In many of the current AM tools, the energy source or the stage holding the build (the article being built) is moved in a 2D pattern motion which defines the build-slice layer (base layer of the article being built). At the completion of the layer, more material is added and the build is lowered (as for example in the case where material is added in a powder-bed form) for the next build layer. Recent interest in, and development of, AM technology can at least partially be attributed to the development of very stable high power (200-400 W) fiber lasers that permit continuous layer-by-layer assembly that could last weeks for very large articles (e.g., articles having a volume on the order of 50×50×50 cm$^3$). The first generation AM tools, for both polymer and metal, were intended as prototyping machines (e.g., for use in preparing prototypes for use in shape-form analysis). However, with recent advances in source material powder, rapid prototype tooling has evolved and is now poised to provide on-demand manufacturing.

For information regarding various exemplary implementations of AM, see the following references, the entire contents of each of which are incorporated by reference herein: Gu et al., "Laser additive manufacturing of metallic components: materials, processes, and mechanisms", International Materials Review, 57(3): 133-164 (2012); Frazier, "Metal additive manufacturing: a review", J. Mater. Eng. Perf. 23: 1917-1928 (2014); and Herderick, "Progress in additive manufacturing", The Minerals, Metals & Materials Society (JOM), 67(3): 580-581 (2015).

SUMMARY

Embodiments of the present invention provide systems and methods for monitoring temperature using acoustic waves during processing of a material.

Under one aspect, a method of processing a material includes heating a first region of the material with a first energy source; exciting a first acoustic wave in the material; and transmitting the first acoustic wave through the heated first region of the material, the heated first region of the material changing at least one property of the first acoustic wave. The method also can include detecting the change in at least one property of the first acoustic wave; characterizing a temperature of the material in the heated first region based on the detected change in at least one property of the first acoustic wave; and comparing the characterized temperature of the material in the heated first region to a threshold. The method further can include, based on the characterized temperature of the material in the first region being less than the threshold or being above the threshold for an insufficient amount of time, modifying a property of the heated first region with a second energy source.

In some embodiments, the method further includes, responsive to heating the first region of the material with the first energy source, melting a powder or a wire in the first region to form the material.

In some embodiments, the method further includes, responsive to heating the first region of the material with the first energy source, excising a portion of the material.

In some embodiments, the first energy source includes a first laser or a first particle beam. In some embodiments, the first laser excites the first acoustic wave. In some embodiments, the second energy source includes a second laser or a second particle beam that is discrete from the first laser or the first particle beam.

In some embodiments, the change in at least one property of the first acoustic wave includes a change in an arrival time, a change in a disturbance amplitude, or changes both in the arrival time and the disturbance amplitude, of at least one frequency component of the first acoustic wave. In some embodiments, detecting the change in the arrival time, the change in the disturbance amplitude, or the changes both in the arrival time and the disturbance amplitude, of the at least one frequency component of the first acoustic wave includes receiving laser light reflected from the material.

In some embodiments, the acoustic wave includes one or more of a surface acoustic wave, a bulk acoustic wave, a guided acoustic wave, and a phonon.

In some embodiments, the method further includes characterizing a defect in a morphology of the material in the heated first region based on the detected change in at least one property of the first acoustic wave; and based on the characterized defect, heating the first region of the material to a temperature above the threshold with the second energy source.

In some embodiments, modifying the property of the heated first region with the second energy source includes heating the first region of the material to a temperature above the threshold.

In some embodiments, the method further includes exciting a second acoustic wave in the material; transmitting the second acoustic wave through a heated second region of the material, the heated second region of the material changing at least one property of the second acoustic wave; and detecting the change in at least one property of the second acoustic wave. The method further can include characterizing a temperature of the material in the heated second region based on the detected change in at least one property of the second acoustic wave; comparing the characterized temperature of the material in the heated second region to a threshold; and based on the characterized temperature of the material in the second region being less than the threshold or being above the threshold for an insufficient amount of time, modifying a property of the heated second region with the second energy source or with a third energy source.

Under another aspect, a system for processing a material includes a first energy source; a second energy source; a first acoustic wave generator; a first acoustic wave detector; and a controller coupled to the first energy source. The second energy source, the first acoustic wave generator, and the first acoustic wave detector, the controller can be configured so as to: control the first energy source so as to heat a first region of the material; control the first acoustic wave generator so as to excite a first acoustic wave in the material, the first acoustic wave being transmitted through the heated first region of the material, the heated first region of the material changing at least one property of the first acoustic wave; control the first acoustic wave detector so as to detect the change in at least one property of the first acoustic wave; characterize a temperature of the material in the heated first region based on the detected change in at least one property of the first acoustic wave; compare the characterized temperature of the material in the heated first region to a threshold; and based on the characterized temperature of the material in the heated first region being less than the threshold or being above the threshold for an insufficient amount of time, control the second energy source so as to modify a property of the heated first region.

In some embodiments, heating the first region of the material by the first energy source melts a powder or a wire in the first region to form the material.

In some embodiments, heating the first region of the material by the first energy source excises a portion of the material.

In some embodiments, the first energy source includes a first laser or a first particle beam. In some embodiments, the first acoustic wave generator includes the first laser. In some embodiments, the second energy source includes a second laser or a second particle beam that is discrete from the first laser or the first particle beam.

In some embodiments, the change in at least one property of the first acoustic wave is based on detecting a change in an arrival time, a change in a disturbance amplitude, or changes both in the arrival time and the disturbance amplitude, of at least one frequency component of the first acoustic wave. In some embodiments, the first acoustic wave detector is configured to detect the change in the arrival time, the change in the disturbance amplitude, or the changes both in the arrival time and the disturbance amplitude, of the at least one frequency component of the first acoustic wave based on receiving laser light reflected from the material.

In some embodiments, the acoustic wave includes one or more of a surface acoustic wave, a bulk acoustic wave, a guided acoustic wave, and a phonon.

In some embodiments, the controller further is configured to: characterize a defect in a morphology of the material in the heated first region based on the detected change in at least one property of the first acoustic wave; and based on the characterized defect, control the second energy source so as to heat the first region of the material to a temperature above the threshold.

In some embodiments, modifying the property of the heated first region with the second energy source includes heating the first region of the material to a temperature above the threshold.

In some embodiments, the system further includes a second acoustic wave generator; and a second acoustic wave detector. The controller can be coupled to the second acoustic wave generator and the second acoustic wave detector. The controller further can be configured so as to: control the second acoustic wave generator so as to excite a second acoustic wave in the material, the second acoustic wave being transmitted through a heated second region of the material, the heated second region of the material changing at least one property of the second acoustic wave; control the second acoustic wave detector so as to detect the change in at least one property of the second acoustic wave; characterize a temperature of the material in the heated second region based on the detected change in at least one property of the second acoustic wave; compare the characterized temperature of the material in the heated second region to a threshold; and based on the characterized temperature of the material in the second region being less than the threshold or being above the threshold for an insufficient amount of time, control the second energy source or a third energy source so as to heat the second region of the material to a temperature above the threshold.

DETAILED DESCRIPTION

Figure 1A:
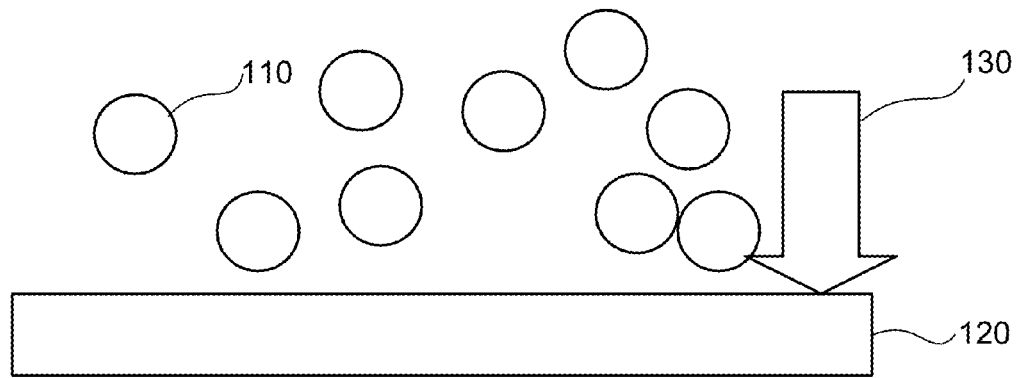
FIGS. 1A-1C schematically illustrate steps during a previously known method of processing a material.

Embodiments of the present invention provide systems and methods for monitoring temperature using acoustic waves during processing of a material. For example, it would be desirable to reduce the manufacturing cost of AM, while providing true manufacturing scale tooling that can deliver parts repetitively and substantially without defects. However, as a material processing tool for industrial applications, previously known technology is believed to lack sufficient process control, such as knowledge of the surface temperature at the build zone or knowledge of molten build volume or knowledge of the local surface roughness after cooling which regulates the quality of the layer-by-layer additive process. Without wishing to be bound by any theory, it is believed that without adequate and timely knowledge of one or all of such parameters, it can be difficult to build a tool that enables for corrective action prior to applying the next additive layer. For example, defects as gross as microscopic pores potentially could be incorporated into the build, only to be found during a post build certification test, thus making it difficult to actualize the industrial demand for "certify the part as you build."

Embodiments of the present invention can facilitate monitoring of temperature during processing of a material and by analysis the molten build volume. For example, in some embodiments, the present systems and methods addresses process control in AM tooling, and can provide monitoring of some or all of the local temperature, cooling rate and surface roughness during additive processing. In some embodiments, the present systems and methods can provide a non-intrusive, non-damaging, near real time process monitor which can be directly applied in AM technology without necessarily requiring re-design of the tooling, by providing an all optical monitoring scheme. For example, the present systems and methods can include use of an acoustic detector that includes a non-contact, low power laser to accomplish in situ monitoring in any suitable material processing technique, including but not limited to AM such as in traditional laser subtractive material processing.

Illustratively, a pulsed laser can be used to generate ultrasonic (>1 MHz) surface acoustic waves (SAWs) on the material of interest without damaging the surface. Alternatively, the energy source for the material processing, such as a pulsed laser, can generate the acoustic waves. In some embodiments, the propagating surface displacement wave traverses the local area of interest as a probe and can be detected, some distance away, by another low power CW laser that can be, but need not necessarily be, configured as a heterodyne surface displacement sensor. In an exemplary AM tooling application, the probe and sensor lasers optionally can straddle the build zone (e.g., be spaced mm apart) so as to provide near real time information on the surface properties. Based on characterization of the temperature or morphology of the material, or both temperature and morphology, appropriate corrective action can be taken prior to the addition of the next build layer material. In an exemplary laser subtractive application the probe and sensor lasers optionally can straddle the subtractive zone (e.g., can be spaced mm apart) so as to provide near real time information on the surface properties around the subtractive. Based on characterization of the temperature or morphology of the material, or both temperature and morphology, appropriate corrective action can be taken as for example to stop the subtractive process or to anneal the surrounding area. In an exemplary AM tooling application, the probe and sensor lasers optionally can straddle the build zone (e.g., be spaced mm apart) so as to provide near real time information on the molten volume properties by measuring the arrival time (as in a pulse echo) of various SAW and volumetric waves (i.e. those that penetrate the volume).

Embodiments of the present systems and methods can utilize one or more properties of propagating acoustic waves. One such property is the dependence of the speed of sound (in the material) on the temperature. Another such property is the dependence of the wave scattering efficiency with the feature size (e.g., dimension) of the scattering center. In some embodiments, the acoustic wave can be generated with a relatively short pulse laser so as to generate a wide bandwidth acoustic wave packet (e.g., having a wide range of wavelengths). Some embodiments implement a time-resolved laser heterodyne spectrometer to "sense" properties of some or all of the propagating acoustic waves. The acoustic sensor can use the arrival time of the acoustic wave packet or the displacement amplitude of the acoustic wave packet to characterize information on changes in the local temperature or to analyze the change in the power spectral density (e.g., amplitude of each wavelength or frequency), which can be linked to scattering processes and roughness. By "arrival time," several conventions can be used. It is typically meant the time at which the maximum power of the acoustic wave, at a particular frequency or frequency band, arrives at an acoustic wave detector. By "displacement amplitude" it is meant the amplitude profile of the displacement of the surface atoms/molecules as a function of time as a result of the propagating acoustic wave at acoustic wave detector.

In one non-limiting example, signals at 5 kHz can be captured and analyzed, and as a result the local properties can be characterized for each build-laser spot size (~50 microns) for build speeds of 50-100 mm/sec. Such build speeds are typical for manufacturing complex shape parts (higher build speeds are typical for simple box shapes). Accordingly, some embodiments of the present systems and methods can provide the desired information at fast enough speed to enable implementation of corrective action schemes, e.g., heating the material with another energy source to a sufficient temperature, prior to additional layering or for subtractive processing annealing or smoothing the local area. Moreover, the high data acquisition speed also can permit a full map documentation of the part which can be useful for a "certify as you build" manufacturing architecture. Additionally, the present systems and methods suitably can be implemented without necessarily disturbing the existing AM process (whether it uses a laser, electron beam, or other energy source for the build).

In one non-limiting example, signals of both the SAWs and volumetric waves can be captured and analyzed with arrival time of the volumetric waves that have echoed off interfaces (e.g. molten/solid, solid/molten, molten/powder) used to characterize the build volume or the molten zone.

While some embodiments of the present systems and methods provided herein can be applied to AM tooling for metals, it should be noted that some embodiments suitably can be applied to other AM materials (e.g., polymers). In the case of the metal parts manufactured by AM technology, certification of a part can depend on the metallurgy (e.g., the technique of working or heating metals so as to give them desired shapes or desired structural or chemical properties) and the morphology, or lack of defects (e.g., defects such as micro-pores). In the former (metallurgy), the temperature at which the material is processed is an exemplary parameter, and can include the temperature to which the material is raised, the duration for which the material is raised above that temperature, and the cooling rate at which the material decreases back to a baseline temperature. In the latter (morphology), an exemplary parameter is the surface roughness of each build-layer which serves as a foundation for the next additive layer. Another exemplary parameter is the laser power; fluctuations in the laser power can affect the local temperature and potentially can leave embedded defects (e.g., a trapped unmelted powder volume or frozen-"hole" pocket).

Previously known AM tooling closely monitors the laser power upstream of the laser material interaction zone. Such laser power monitoring potentially could be sufficient if there were no relative motion between the laser beam and the new precursor material (e.g., a powder), but at least some amount of such relative motion is believed to be present in any physical implementation. Any variation in the relative motion can be imprinted in the interaction between the laser and precursor material. The issue can be compounded if variations exist in the amount and density of precursor material. An exemplary consequence is that even if the laser power remains stable, the formed part nonetheless can display the imprinted variations and this could lead to a process non-uniformity. For example, slightly less laser exposure (e.g., duration) at a processing zone potentially yield too low a melting/sintering temperature, while an extended stay potentially can result in superheating (e.g., resulting in bubbles, ablation, frozen-hole pockets).

Figure 1B:
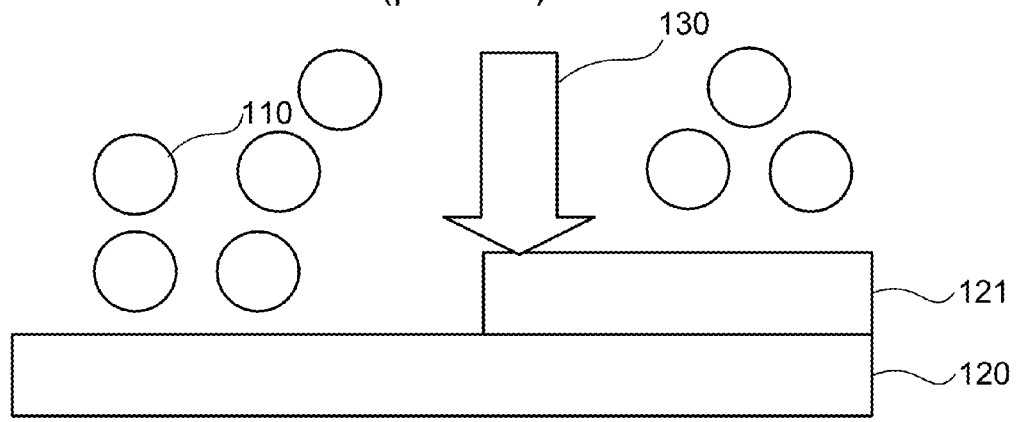
Figure 1C:
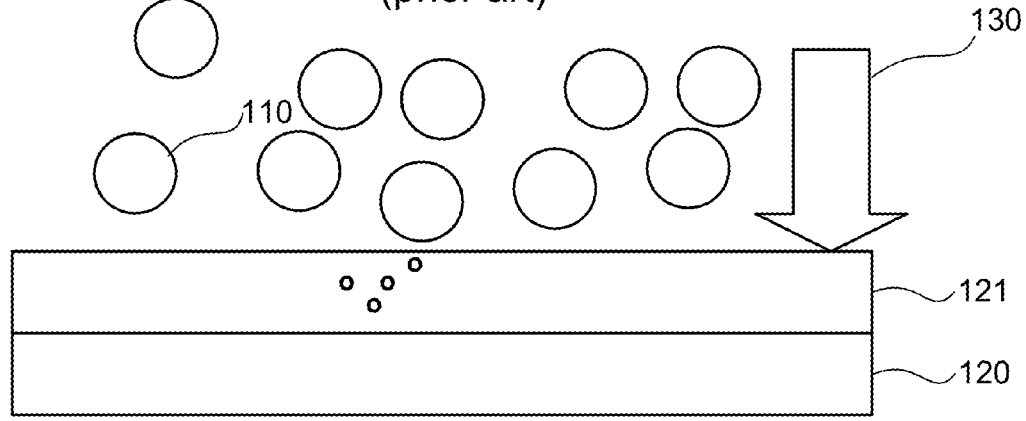

For example, FIGS. 1A-1C schematically illustrate steps during a previously known method of processing a material. In FIG. 1A, first layer 120 of material has been formed using an AM technique, and energy source 130 (e.g., laser beam or electron beam) begins to heat first layer 120 in the presence of precursor material 110, e.g., a powder that, when heated, forms the material. In FIG. 1B, energy source 130 has continued to serially (going from right to left) heat regions of first layer 120 in the presence of precursor material 110 so as to form second layer 121 of material disposed on first layer 120. In FIG. 1C, energy source 130 can return to the starting position and begin to serially (going from right to left) form another layer of material disposed on second layer 121. However, during formation of second layer 121, the temperature generated by energy source 130 may be insufficiently high, or may be sufficiently high but for an insufficient amount of time, to fully convert precursor material 110 into the material. Accordingly, one or more regions of second layer 121 can include morphology defects, represented in FIG. 1C by "o," that potentially can render the resulting article unsuitable for its intended purpose. However, using previously known technology, such defects may not be detected until the completed article is submitted for certification (typically X-ray imaging), or even until the completed article is put into service.

Previously known methods for attempting to monitor temperature include the use of infrared (IR) camera imaging technology as a temperature monitor. However, although IR cameras (e.g., forward looking infrared, or FLIR, cameras) can provide temperature data, such cameras operate at a imaging rate of about 30-45 Hz, and the temperature value obtained using the camera is a strong function of the surface emissivity. While the former drawback (imaging rate) can be compensated for by building at a slower speed (opposite to the industry's desire), the latter drawback (function of surface emissivity) can make IR camera imaging technology relatively undesirable. For example, the efficiency of a surface to emit thermal radiation can depends on some or all of the material, the structural shape, and the ability of the camera to capture the emitted radiation in contrast to the surrounding area. In AM, articles can be fashioned in free-form and the local emissivity can vary over time. Without wishing to be bound by any theory, it is believed that some embodiments of the present systems and methods can solve one or both of such issues at data acquisition speeds measured in KHz. For further details regarding IR camera based techniques, see the following references, the entire contents of each of which are incorporated herein by reference: Elhadj et al., "Combined infrared thermal imaging and laser heating for the study of materials for thermophysical and processing properties at high temperatures," Critical Reviews in Solid State and Materials Sciences, LLNL-JRNL-584155, pages 1-35 (2012); Doubenskaia et al., "Comprehensive optical monitoring of selective laser melting," Journal of Laser Micro/Nanoengineering 7(3): 236-243 (2012); Chryssolouris, "Sensors in laser machining," Annals of the CIRP 43(2): 513-519 (1994); and Mireles et al., "Closed-loop automatic feedback control in electron beam melting," Int. J. Adv. Technol. 78: 1193-1199 (2015).

Previously known methods for attempting to monitor temperature include the use of imaging techniques such as Schlieren imaging using an imaging camera. However, such techniques that measure surface displacement by optical interferometry or holographic means require camera exposure time to form an image. Consequently, such techniques are affected by optical phase variations induced by the heat source acting on the above surface ambient gas effecting nulling the desired temperature information. Without wishing to be bound by any theory, it is believed that some embodiments of the present systems and methods can solve such issues at data acquisition because given the speed of sound for most materials, the use of a pulsed acoustic wave and the relatively small size of the sensor, the displacement wave disturbance at the sensor is on the order 10 s of nanoseconds which effectively mitigate the effects of heated air currents on the optical sensor beam.

Additionally, note that the present systems and methods also can be used to measure temperature using acoustic waves for material processing techniques other than AM. For example, the present systems and methods suitably can be used with any materials processing technique in which the temperature of a region of a material is changed, and in which it would be useful to monitor the temperature to which that region of material is changed. Such materials processing techniques can include, but are not limited to, laser machining in which the temperature of a region of a material is increased so as to excise a portion of the material. Another processing technique is in laser induced shock peening (shock peening is a surface engineering process to impart beneficial residual stress in materials for fatigue, corrosion and cracking). The amount of residual stress is correlated to the laser fluence (energy/unit area) but also to the peak temperature reached. Because the present systems and methods can be implemented in a time resolved manner, they can be used to measure (document) the temperature increase. Another example is in metal welding (performed, for example, with lasers) where a molten material penetrates to the surface to be welded (e.g. keyhole weld). The properties of ultrasonic waves in liquids (molten material) and solids are different and this difference can be used to measure whether two surfaces were welded properly. Because pulsed lasers exist at 1 MHz repetition rates and higher, some embodiments of the present systems and methods can follow the solidification front (~100 m/s) during a weld or during AM manufacturing. Another example is measuring an external or internal condition or force, other than temperature, that alters speed of sound locally. For example, stress in a material can alter the material's speed of sound and for example materials that have piezoelectric or piezomagnetic properties can show changes in the speed of sound upon electric or magnetic excitation. The present systems and methods can measure the change in the speed of sound and the results can be related to the applied stress.

FIGS. 2A-2D schematically illustrate steps during an exemplary method for monitoring temperature using acoustic waves during processing of a material, according to some embodiments. In the embodiment illustrated in FIG. 2A, first layer 220 of material has been formed using an AM technique, and energy source 230 (e.g., laser beam or particle beam, such as an electron beam, proton beam, or neutron beam) heats first layer 220 in the presence of precursor material 210, e.g., a powder, paste, or wire that, when heated, forms the material, so as to form second layer 221 disposed on first layer 220. In some embodiments, energy source 230 is pulsed so as to generate an acoustic wave within the material. For example, in the embodiment illustrated in FIG. 2B, heat 233 (note: energy source 230 not shown) deposited by energy source 230 causes rapid thermal expansion of a first region of the material of second layer 221, which excites one or more acoustic waves 232 within the material of second layer 221. The acoustic wave(s) can include one or more of a surface acoustic wave, a bulk acoustic wave, a guided acoustic wave (denoted by the angled arrows within the material of second layer 221), or a phonon (in the case of crystalline material). One or more of such acoustic waves 232 can be transmitted through the first region of the material, and the temperature and morphology of the first region of the material can change at least one property of the acoustic wave. The changes in the property are detected by laser beam 250. In other embodiments, such as described below with reference to FIGS. 3A-3B, the acoustic wave(s) can be excited using a separate acoustic energy generator that is discrete from energy source 230.

Figure 2A:
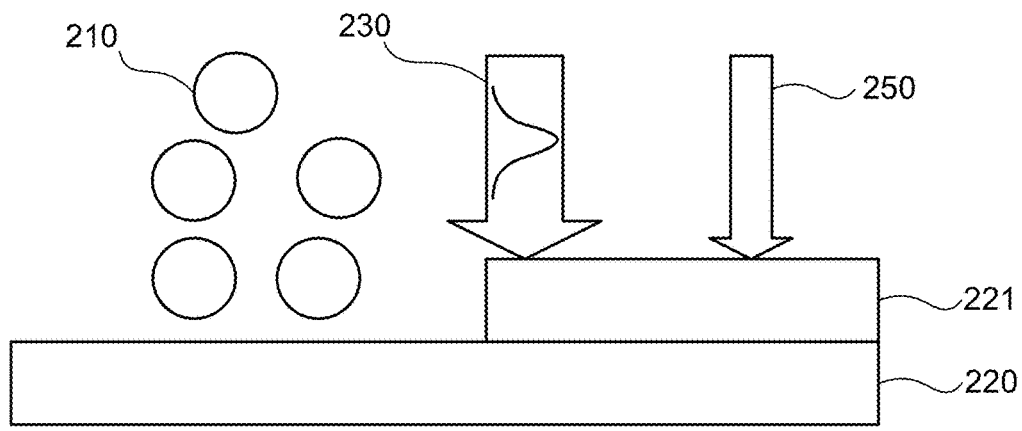
FIGS. 2A-2D schematically illustrate steps during an exemplary method for monitoring temperature using acoustic waves during processing of a material, according to some embodiments.
Figure 2B:
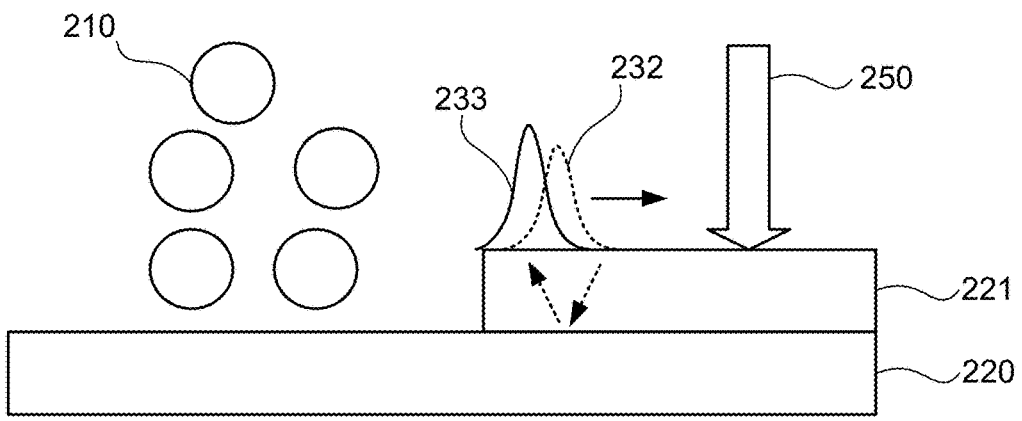
Figure 2C:
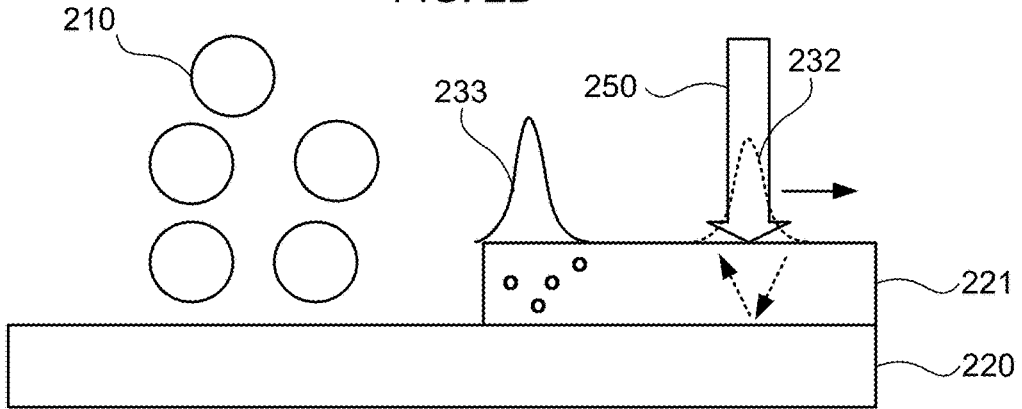

For example, in the embodiment illustrated in FIG. 2C, acoustic wave 232 propagates from the first region of layer 221, at which heat 233 was deposited and at which acoustic wave 232 was excited, to a region of second layer 221 at which an acoustic wave detector 250 is arranged. Acoustic wave detector 250 can include, for example, a laser beam that irradiates the surface of layer 221 and detects the arrival time or the disturbance amplitude, or both the arrival time and the disturbance amplitude, of acoustic wave 232. Alternatively, acoustic wave detector 250 can include any suitable combination of hardware and software configured to detect an acoustic wave, such as a piezoelectric device, or any other custom or commercially available device or device yet to be developed. The temperature or the morphology of the material can cause changes in the arrival time or in the disturbance amplitude, or in both the arrival time and in the disturbance amplitude, of acoustic wave 232. For example, in the embodiment illustrated in FIG. 2C, heat 233 may not have raised the temperature of the material to a sufficient level so as to fully process the material, or heat 233 may have raised the temperature to a sufficient level but for an insufficient amount of time so as to fully process the material. As a result, the first region of second layer 221 can include morphology defects, represented in FIG. 2C by "o," that potentially can render the resulting article unsuitable for its intended purpose. One or more characteristics of acoustic wave 232 effectively can record such temperature or such morphology, or both such temperature and such morphology, based upon which the temperature or morphology, or both, can be characterized.

Figure 2D:
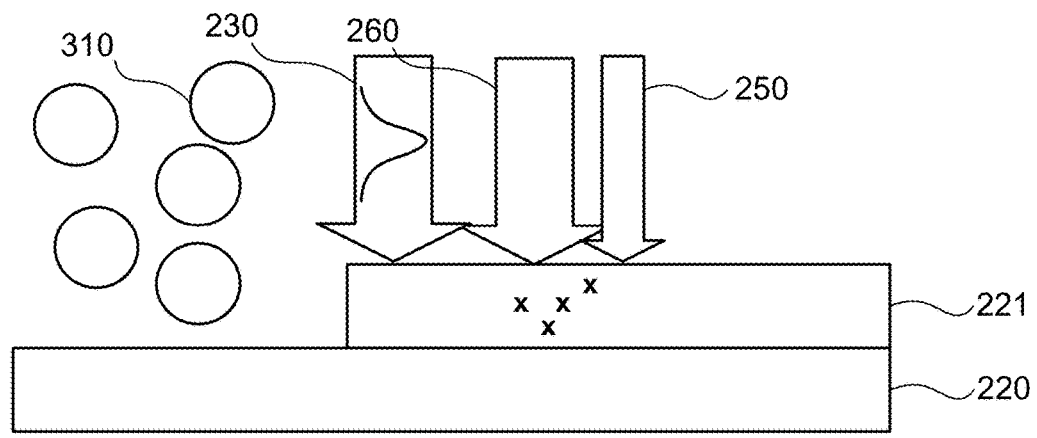

Some embodiments of the present systems and methods can remediate defects in the processing temperature or in the resulting material morphology based on one or more characteristics of acoustic wave 232 after the wave has propagated through the first region. For example, FIG. 2D illustrates an embodiment including application of second energy source 260 (e.g., laser beam or particle beam, such as an electron beam, proton beam, or neutron beam), which in some embodiments can be discrete from energy source 230, to the first region of second layer 221. In other embodiments, second energy source 260 can be provided by energy source 230, such that only one energy source need be provided to both process and remediate the material. Second energy source 260 can heat the first region of second layer 221 to a sufficient temperature, for a sufficient amount of time, so as to remediate defects in the earlier processing of the first region of second layer 221. For example, in a manner such as described in greater detail below with reference to FIG. 5, a controller can be in communication with second energy source 260 and with acoustic wave detector 250, can be configured to characterize the temperature at the first region using acoustic wave detector 250, and, based upon the characterized temperature at the first region being sufficiently low (e.g., less than a threshold temperature at which the material can be properly processed) or based upon the characterized temperature being sufficiently high but for an insufficient amount of time (e.g., being applied for less than a threshold time at which the material can be properly processed), can control second energy source 260 to heat the first region to a sufficient temperature (e.g., at or above the threshold temperature for at or above the threshold time). Additionally, or alternatively, acoustic wave detector 250 can characterize a defect in the morphology, e.g., the structure of second layer 221 at a scale on the order of a wavelength within acoustic wave 223, of the first region of the material based on one or more characteristics of acoustic wave 232, and second energy source 260 can be controlled to heat the first region to a sufficient temperature based on the characterized defect in the morphology.

In FIG. 2D, successful remediation of the first region is illustrated with "x" so as to suggest repair of the defects previously illustrated with "o." Optionally, acoustic wave detector 250 can continue to monitor the temperature at the first region during such remediation, and the remediation can be controlled based on such monitoring. In embodiments such as illustrated in FIG. 2D, energy source 230 optionally can process a second region of the material, e.g., a second region of second layer 221, concurrently with remediation of the first region by second energy source 260. In some embodiments, the lateral spacing between energy source 230 and acoustic wave detector 250 can be substantially fixed relative to one another, such that an arrival time and disturbance amplitude of acoustic waves transmitted across the material can be a function of temperature, morphology, or both temperature and morphology, of the region of the material across which the acoustic waves are transmitted.

Figure 3A:
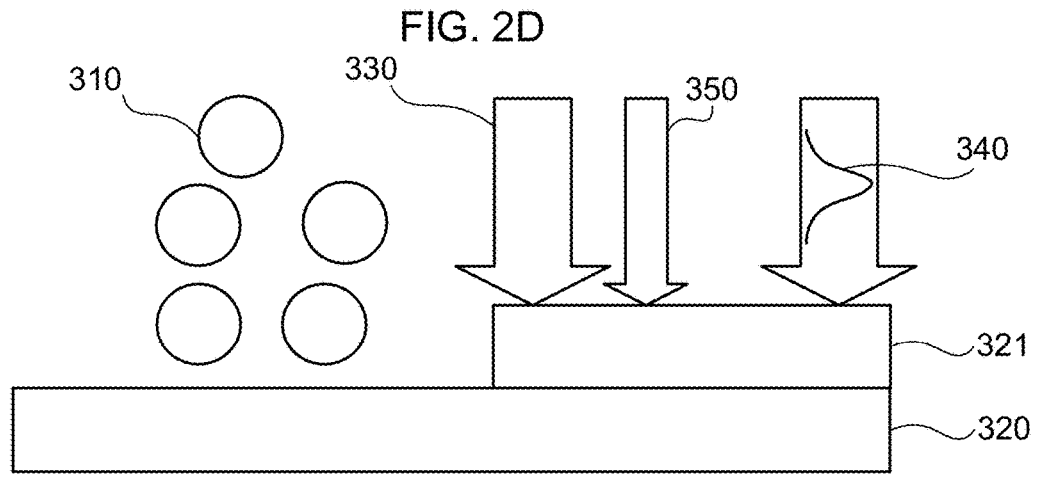
FIGS. 3A-3B schematically illustrate steps during an alternative exemplary method for monitoring temperature using acoustic waves during processing of a material, according to some embodiments.
Figure 3B:
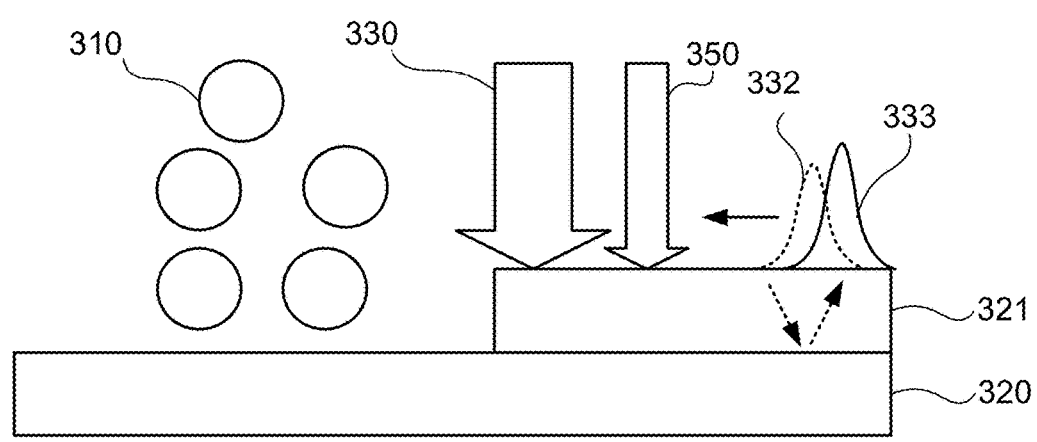

FIGS. 3A-3B schematically illustrate steps during an alternative exemplary method for monitoring temperature using acoustic waves during processing of a material, according to some embodiments. In the embodiment illustrated in FIG. 3A, first layer 320 of material has been formed using an AM technique, and energy source 330 (e.g., laser beam or particle beam, such as an electron beam, proton beam, or neutron beam) heats first layer 320 in the presence of precursor material 310, e.g., a powder that, when heated, forms the material, so as to form second layer 321 disposed on first layer 320. Energy source 330 can be, but need not necessarily be, pulsed so as to generate an acoustic wave within the material. Additionally, acoustic wave generator 340 (e.g., pulsed laser beam) excites an acoustic wave within second layer 321. For example, in FIG. 3B, heat 333 deposited by acoustic wave generator 340 causes rapid thermal expansion of a first region of the material of second layer 321, which excites one or more acoustic waves 333 within the material of second layer 321. The acoustic wave(s) can include one or more of a surface acoustic wave, a bulk acoustic wave, a guided acoustic wave (denoted by the angled arrows within the material of second layer 321), or a phonon. One or more of such acoustic waves 332 can be transmitted through the first region of the material, and the temperature and morphology of the first region of the material can change at least one property of the acoustic wave.

For example, in the embodiment illustrated in FIG. 3B acoustic wave 332 propagates toward a region of layer 321 at which material processing is being performed, to a region of second layer 321 at which an acoustic wave detector 350 is arranged. Acoustic wave detector 350 can include, for example, a laser beam that irradiates the surface of layer 321 and detects the arrival time or the disturbance amplitude, or both the arrival time and the disturbance amplitude, of acoustic wave 332. The temperature or the morphology of the material can cause changes in the arrival time or in the disturbance amplitude, or in both the arrival time and in the disturbance amplitude, of acoustic wave 332, based upon which defects can be remediated in a manner analogous to that described above with reference to FIGS. 2A-2D.

As such, the present systems and methods can provide in-line, real-time monitoring and remediation of material processing, including but not limited to AM processing. For example, implementation of the present systems and methods during AM processing can facilitate characterization and remediation of a layer while that layer is being processed, so that the layer may have substantially no defects before the next layer is processed so as to be disposed upon that layer. In comparison, previously known techniques can process the next layer so as to be disposed upon a layer without sufficiently characterizing the temperature(s) at which respective regions of that layer were processed, nor the resulting morphology, let alone remediating that layer before processing the next layer. As such, previously known techniques can embed significant defects within an article, which can result in significant waste of resources in processing the remainder of an article that ultimately may be unusable.

Additionally, note that schemes such as illustrated in FIGS. 2A-2D and 3A-3B suitably can be adapted for use with material processing techniques other than AM. For example, energy sources 230 or 330 can perform any suitable material processing technique such as laser machining, responsive to which one or more characteristics of acoustic waves 232 or 332 respectively can be modified. Optionally, based upon one or more changes to characteristics of acoustic waves 232 or 332, e.g., responsive to changes in temperature or morphology, or both temperature and morphology of the material, the material can be remediated using a second energy source.

Figure 4:
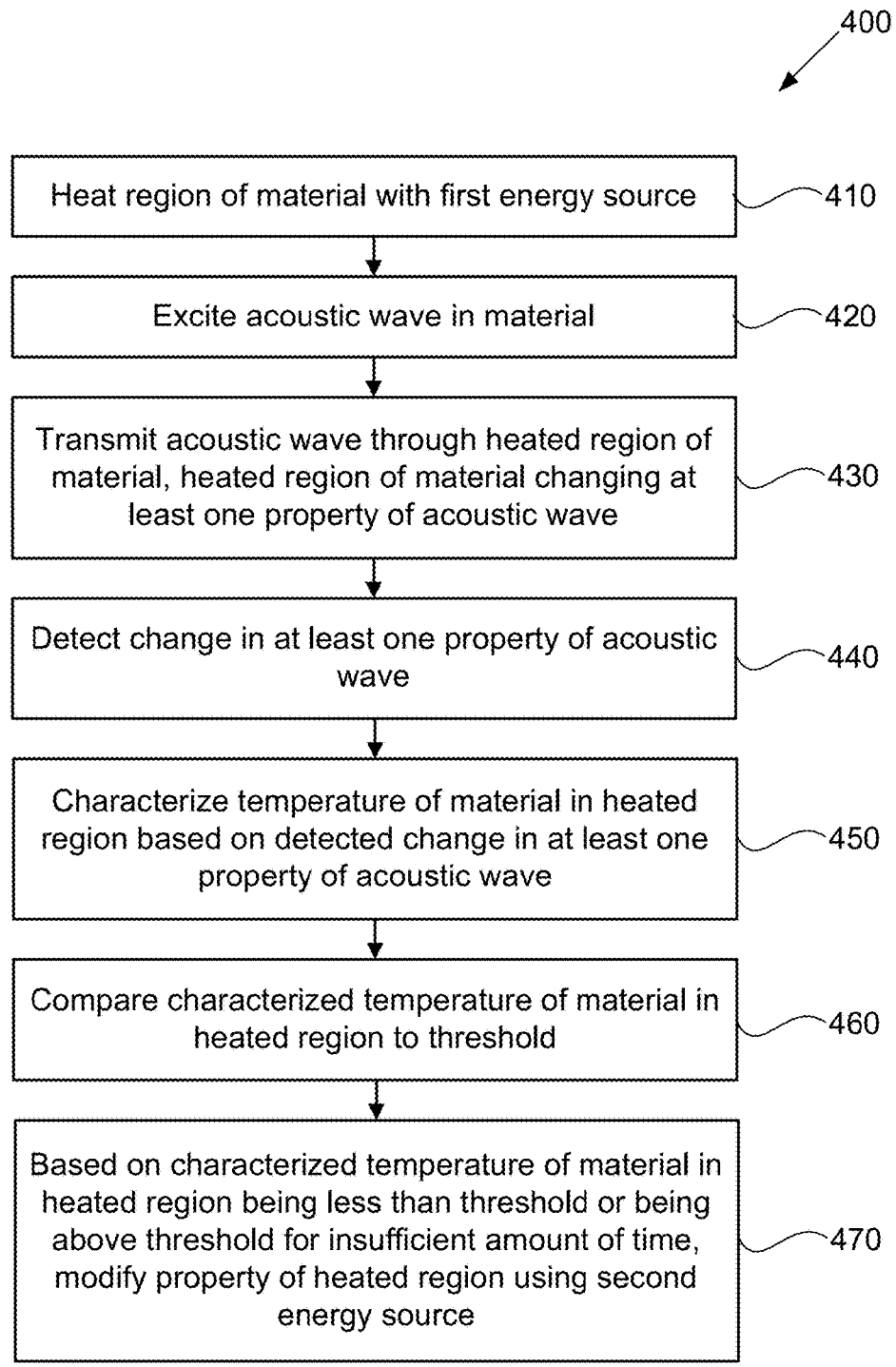
FIG. 4 illustrate a flow of steps during an exemplary method for monitoring temperature using acoustic waves during processing of a material, according to some embodiments.

FIG. 4 illustrate a flow of steps during an exemplary method for monitoring temperature using acoustic waves during processing of a material, according to some embodiments. Method 400 includes heating a region of the material with a first energy source (step 410). For example, the first energy source can include any suitable laser beam or particle beam, such as an electron beam, proton beam, or neutron beam. In some embodiments, the first energy source can be focused at or below the surface of the heated region of the material. In some embodiments, method 400 further includes, responsive to heating the region of the material with the first energy source, melting a powder or a wire in the heated region to form the material. As one non-limiting example, heat deposited by the first energy source can cause conversion of a precursor into the material. In some embodiments, method 400 further includes, responsive to heating the region of the material with the first energy source, excising a portion of the material or peening it or welding it. As one non-limiting example, heat deposited by the first energy source can cause excision of the material.

Method 400 illustrated in FIG. 4 also includes exciting a first acoustic wave in the material (step 420). For example, in some embodiments, the first energy source can include an acoustic wave generator. Illustratively, the first energy source can be pulsed, and the heat deposited by the first energy source can cause rapid thermal expansion of the material, which can excite the first acoustic wave in a manner such as described above with reference to FIGS. 2A-2D. In other embodiments, a separate acoustic wave generator can be used to excite the first acoustic wave, such as a pulsed laser beam that is focused to the surface of the material at a spaced distance from the first energy source and deposits heat that causes rapid thermal expansion of the material, which can excite the first acoustic wave in a manner such as described above with reference to FIGS. 3A-3B. The acoustic wave can include one or more of a surface acoustic wave, a bulk acoustic wave, a guided acoustic wave, and a phonon.

Method 400 illustrated in FIG. 4 further includes transmitting the first acoustic wave through the heated region of the material, the heated region of the material changing at least one property of the first acoustic wave (step 430). For example, the temperature at the heated region of the material can change the arrival time, the disturbance amplitude, or both the arrival time and the disturbance amplitude of the first acoustic wave. Such changes can be detected by an acoustic wave detector, a non-limiting example of which can include a laser beam that is focused at the surface of the material and reflected to any suitable combination of optics and electronics configured to characterize the arrival time, the disturbance amplitude, or both the arrival time and the disturbance amplitude of the first acoustic wave based on intensity or phase characteristics of the reflected laser beam. Another non-limiting example of an acoustic wave detector includes a piezoelectric device that can be coupled to the material. Another non-limiting example of an acoustic wave detector includes any suitable combination of optics and electronics configured to characterize the arrival time, the disturbance amplitude, or both the arrival time and the disturbance amplitude of the first acoustic wave based on conversion of an acoustic phonon (acoustic wave of a defined mode propagating within a crystalline material) into optical radiation that is received by the optics and electronics.

Method 400 illustrated in FIG. 4 also includes detecting the change in at least one property of the first acoustic wave (step 440). Illustratively, the change in at least one property of the first acoustic wave includes a change in an arrival time, a change in a disturbance amplitude, or changes both in the arrival time and the disturbance amplitude, of at least one frequency component of the first acoustic wave. Detecting the change in the arrival time, the change in the disturbance amplitude, or the changes both in the arrival time and the disturbance amplitude, of the at least one frequency component of the first acoustic wave optionally can include receiving laser light reflected from the material. In one nonlimiting example, the acoustic wave detector can be coupled to a controller (e.g., that includes a memory and a suitably programmed processor) that is configured to compare one or more characteristics of the first acoustic wave to stored information about the transmission about acoustic waves through the material at different temperatures or with different morphologies, or at both different temperatures and different morphologies, and to identify one or more changes in one or more characteristics of the first acoustic wave based on the comparison. For example, the controller can compare the arrival time of the first acoustic wave, e.g., can compare the time at which the maximum power of the acoustic wave arrives at acoustic wave detector, to a stored arrival time corresponding to a baseline condition, such as an arrival time at a known temperature (illustratively, 400° C.). Based on the difference between the arrival time of the first acoustic wave and the stored arrival time, the controller can detect the change in the arrival time of the first acoustic wave. Or, for example, the controller can compare the disturbance amplitude of the first acoustic wave, e.g., can compare the amplitude profile as a function of time of the acoustic wave arrives at acoustic wave detector, to a stored amplitude profile as a function of time corresponding to a baseline condition, such as a disturbance amplitude at a known temperature (illustratively, 400° C.) or for a known morphology (illustratively, a defect-free material). Based on the difference between the disturbance amplitude of the first acoustic wave and the stored disturbance amplitude, the controller can detect the change in the disturbance amplitude of the first acoustic wave.

Method 400 illustrated in FIG. 4 also includes characterizing a temperature of the material in the heated region based on the detected change in at least one property of the first acoustic wave (step 450). Illustratively, based on the arrival time being a defined amount before or after the baseline arrival time, the controller can be configured to characterize the temperature as being a certain amount above or below the temperature at which the baseline was obtained. As another example, based on the change in the disturbance amplitude having a particular profile as a function of time, the controller can be configured to characterize the temperature as being a certain amount above or below the temperature at which the baseline was obtained, or can be configured to identify that defects of a particular size are present.

Method 400 illustrated in FIG. 4 also includes characterizing a temperature of the material in the heated region based on the detected change in at least one property of the first acoustic wave (step 450). Illustratively, based on the arrival time being a defined amount before or after the baseline arrival time, the controller can be configured to characterize the temperature as being a certain amount above or below the temperature at which the baseline was obtained. This information when coupled with the change in the disturbance profile as a function of time, the controller can be configured to characterize the type of wave (e.g. SAW, bulk wave, surface skimming wave) and thereby allow identification of the build volume or melt zone.

Method 400 illustrated in FIG. 4 further can include comparing the characterized temperature of the material in the heated region to a threshold (step 460). For example, the controller can be configured to compare the characterized temperature of the material to a stored threshold, e.g., a threshold that corresponds to a temperature that is sufficiently high for the material to be processed properly. In some embodiments, the threshold also includes a time threshold. For example, the controller can be configured to collect a sequence of temperature measurements over time, and can be configured to determine whether a sufficient number of such measurements were at or exceeded a temperature that is sufficiently high for the material to be processed properly. Optionally, the controller can be configured to compare the size of defects in the morphology of the material to a threshold corresponding to a size of defect above which the material is to be remediated.

Method 400 illustrated in FIG. 4 also includes, based on the characterized temperature of the material in the heated region being less than the threshold or being above the threshold for an insufficient amount of time, modifying a property of the heated region using a second energy source (step 470). For example, step 470 can include heating the region of the material to a temperature above the threshold with a second energy source. For example, a second energy source (e.g., laser beam or particle beam) can be, but need not necessarily be, discrete from the first energy source, and can be applied to the heated region of the material based upon a determination that the temperature was insufficiently high, or was sufficiently high but for an insufficient amount of time in a manner such as described above with reference to FIG. 2D. Additionally, or alternatively, the second energy source can be applied to the heated region based on defects in the heated region being characterized as being sufficiently large. For example, method 400 can include, based on the characterized defect, heating the heated region of the material to a temperature above the threshold with a second energy source in a manner such as described above with reference to FIG. 2D.

Note that steps 420-470 suitably can be executed, in series or in parallel, across any desired number of regions of the material. For example, method 400 optionally can include exciting a second acoustic wave in the material, e.g., using a second acoustic wave generator disposed at a region of the material that is different than the heated region of the material. Method 400 further optionally can include transmitting the second acoustic wave through a heated second region of the material, the heated second region of the material changing at least one property of the second acoustic wave. For example, the first energy source used to heat the material during step 410 further can cause temperature increases at other regions of the substrate. Method 400 optionally further can include detecting the change in at least one property of the second acoustic wave, e.g., using a second acoustic wave detector disposed at a region of the material that is different than the region at which the first acoustic wave detector is disposed. Method 400 optionally further can include characterizing a temperature of the material in the heated second region based on the detected change in at least one property of the second acoustic wave in a manner analogous to that described above with reference to step 450. Method 400 optionally further can include comparing the characterized temperature of the material in the heated second region to a threshold in a manner analogous to that described above with reference to step 460. Method 400 optionally further can include, based on the characterized temperature of the material in the heated second region being less than the threshold or being above the threshold for an insufficient amount of time, modifying a property of the heated second region with the second energy source or a third energy source, for example, heating the second region of the material to a temperature above the threshold with the second energy source or a third energy source, e.g., in a manner analogous to that described above with reference to step 470. The optional third energy source can be configured analogously to the second energy source, e.g., can include a laser beam or a particle beam, and can be discrete from the first and second energy sources.

Figure 5:
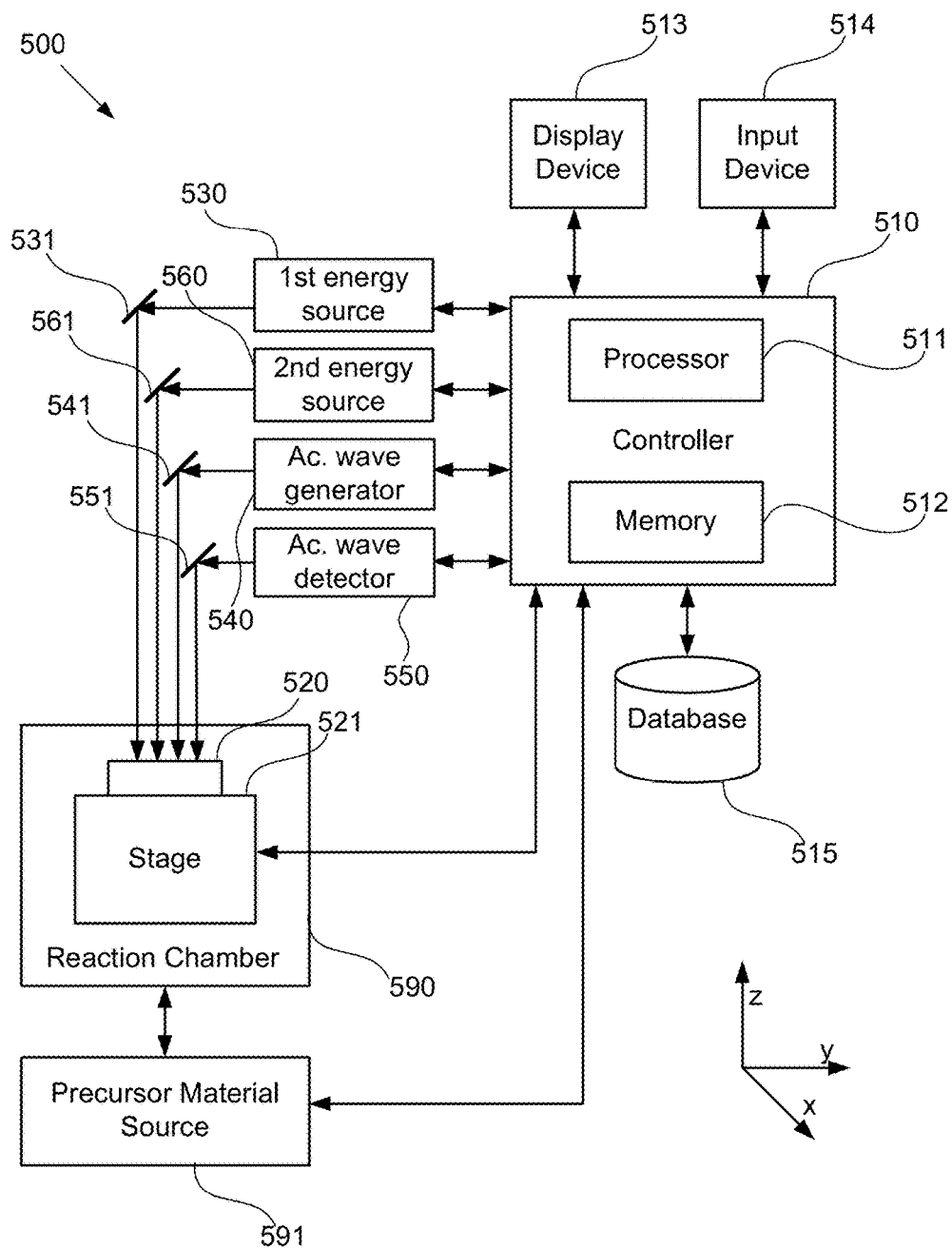
FIG. 5 illustrates an exemplary system for monitoring temperature using acoustic waves during processing of a material, according to some embodiments with the acronym "Ac." meaning acoustic FIG. 6 schematically illustrates steps during another exemplary method for monitoring temperature using acoustic waves during processing of a material, according to some embodiments.

It should be understood that the steps of method 400 can be implemented using any suitable combination of hardware and software. FIG. 5 illustrates an exemplary system for monitoring temperature using acoustic waves during processing of a material, according to some embodiments. System 500 suitably can be configured so as to implement method 400 illustrated in FIG. 4, as well as any other suitable method for processing a monitoring temperature using acoustic waves during processing of a material. It should be understood that the method 400 can be implemented on a plurality of locations each with its own lasers all governed by a master controller.

System 500 illustrated in FIG. 5 includes controller 510, first energy source 530, second energy source 560, acoustic wave generator 540, acoustic wave detector 550, and reaction chamber 590. Controller 510 suitably can be coupled to first energy source 530, second energy source 560, acoustic wave generator 540, acoustic wave detector 550, and reaction chamber 590.

In the embodiment illustrated in FIG. 5, controller 510 includes memory 512 (e.g., a non-transitory computer-readable medium) configured to store processing instructions, processor 511 configured to store the stored processing instructions, display device 513 configured to display data to a user, and input device 514 configured to accept input from a user. Controller 510 also can be in operable communication with database 515, which can store information on how to process a variety of different types of materials, and properties of acoustic waves that can be transmitted across those materials under different processing conditions. Database 515 can be integral to controller 510, or can be remote to controller 510 and in operable communication with controller 510 via a network, such as the Internet.

First energy source 530, second energy source 560, acoustic wave generator 540, and acoustic wave detector 550 can be directed towards, and focused at, material 520 disposed within reaction chamber 590 using any suitable combination of reflective or transmissive elements, respectively illustrated in FIG. 5 as elements 531, 561, 541, and 551. Reaction chamber 590 can include an optical window (not shown) via which one or more of first energy source 530, second energy source 560, acoustic wave generator 540, and acoustic wave detector 550 can access material 520, which in some embodiments can be disposed on stage 521. Stage 521 can be positioned within reaction chamber 590 and can support material 520, and can be operable to adjust the position of the material in the x, y, and z directions responsive to instructions from controller 510. Alternatively, one or more of elements 531, 561, 541, and 551 can include a high speed scanning reflective or transmissive element, optionally including a compensating Z-motion focus unit, that respectively is configured to direct first energy source 530, second energy source 560, acoustic wave generator 540, or acoustic wave detector 550 towards material 520 while maintaining the material in a stationary position. For example, for relatively large reaction chambers (e.g., chambers configured to accommodate an article having an area of one or more square meters) it may be useful to maintain material 520 in a substantially fixed position, while using elements 531, 561, 541, 551 so as respectively to direct energy from first energy source 530, second energy source 560, acoustic wave generator 540, and acoustic wave detector 550 towards different regions of material 520 responsive to appropriate signals provided by controller 510.

In some embodiments, reaction chamber 590 is coupled to precursor material source 591, which can be coupled to controller 510. Illustratively, reaction chamber 590 can be configured to expose material 520 to a suitable flow or volume of precursor material from source 591 for an appropriate amount of time, as well as at a selected temperature (which may be different than the temperature to which first energy source 530 or second energy source 560 heat the material), responsive to appropriate signals provided by controller 510. In one example, material source 591 can include a powder bed that is deposited on the stage 521 and leveled. In another example, material source 591 can include powder spray that is emitted from a nozzle (e.g., near the beam delivery system of first energy source 530). In another example, material source 591 can include a separate robot that is coordinated with stage motion and configured so as to feed wire or paste or gel. In yet another example, material source 591 can include a high speed nozzle that ejects droplets that contain matter to be fused.

First energy source 530 can include any suitable device configured to heat material 520, e.g., responsive to a suitable command provided by controller 510. For example, first energy source 530 can be configured so as to melt a powder or a wire or paste, which can be provided by precursor material source 591 responsive to a suitable command provided by controller 510, to form material 520. Or, for example, first energy source 530 can be configured so as to excise a portion of material 520. In some embodiments, first energy source 530 can include a first laser, a first particle beam source, e.g., a source of an electron beam, neutron beam, or proton beam, or any other suitable custom or commercially available device, or device yet to be developed. Optionally, the first laser can be pulsed. Element 531 can include any suitable combination of elements for directing the energy from first energy source 530 towards material 520 including the use of an optical fiber feed system. In some embodiments, element 531 may not necessarily be needed to direct the energy from first energy source 530 towards material 520.

In some embodiments, first energy source 530 is configured so as to generate sufficient energy so as to alter the source material properties to form the desired material 520 (for example, by melting, fusing, sintering or photophysical cracking). Additionally, or alternatively, first energy source 530 can be configured such that the energy density (energy/area) of the first energy source 530 is above a threshold to form the desired material 520, but sufficiently low so as to inhibit ablation or formation of undesired alloys (as in the case of metals). Illustratively, the energy density can depend on the spot size (typically 20 to 50 microns) and thermodynamic properties of the source material in absorbing the energy and transforming the material to a new state (e.g. melting, sintering). Additionally, or alternatively, first energy source 530 can be configured such that the time duration for which first energy source 530 is applied can be selected based on the thermodynamic properties of the source material (to absorb energy and undergo a phase transformation (e.g. melt)) and based on whether the energy source 530 is a continuous source or pulsed. For example, with pulsed lasers of 10 nanosecond duration and 80% energy absorption, energy density of 1-2 J/cm$^2$ can be used for melting bulk metal. A lower energy density can be used to melt powders (depending, for example, on the particle size in the powder), e.g., based upon the laser repetition rate being greater than 10 Hz or the laser pulsed duration being shorter than 10 nanoseconds.

Second energy source 560 can include any suitable device configured to heat material 520, e.g., responsive to a suitable command provided by controller 510. For example, second energy source 560 can be configured to as to remediate material 520. In some embodiments, second energy source 560 can include a second laser, a second particle beam source, e.g., a source of an electron beam, neutron beam, or proton beam, or any other suitable custom or commercially available device, or device yet to be developed. Element 561 can include any suitable combination of elements for directing the energy from second energy source 560 towards material 520. In some embodiments, element 561 may not necessarily be needed to direct the energy from second energy source 560 towards material 520. Optionally, second energy source 560 includes a second laser or a second particle beam that is discrete from the first laser or the first particle beam of the first energy source 530. In other embodiments, the same energy source suitably can function both as first energy source 530 and second energy source 560, e.g., the same energy source can be configured so as to heat material 520 so as to form the material or to excise a portion of the material, and to remediate the material following such formation or such excision. The second energy source 560 (e.g., the remediation laser) optionally can be less powerful than the first energy source 530 because the goal is to induce slight modifications to the material properties 520 without excising. However, the amount of energy or power applied by second energy source 560 suitably can be selected based on the remediation process to be done. For example, a remediation process to smooth a rough surface can use energy densities of <1 J/cm$^2$ (depending on the material). In another example, a remediation process to seal an embedded micro pore can use a longer duration exposure (e.g., 1-5 msec, depending on the depth). Such parameters suitably can be selected based on the material properties (e.g., energy absorption or optical absorption, density, thermal conductivity, thermal diffusivity, specific heat capacity, melting temperature, vaporization temperature, latent heat of melting, latent heat of vaporization, coefficient of linear expansion, or Young's modulus, as a few exemplary material properties). Additionally, or alternatively, such parameters suitably can be selected based on the energy source parameters (e.g., average energy flux, peak energy flux, or duration of exposure). Additionally, or alternatively, such parameters suitably can be selected based on the energy material interaction (e.g., energy source spot size or incident angle).

Acoustic wave generator 540 can include any suitable device configured to excite an acoustic wave within material 520, e.g., responsive to a suitable command provided by controller 510. For example, in some embodiments, acoustic wave generator 540 can include a pulsed laser configured to emit light of a wavelength selected to be absorbed by material 520 so as to cause rapid thermal expansion of an irradiated region of material 520, and thus excite an acoustic wave. In other embodiments, the same energy source can be configured so as to function both as acoustic wave generator 540 and as first energy source 530 (and optionally also as second energy source 560). For example, in embodiments in which first energy source 530 includes a first laser, that laser also can excite acoustic waves within material 520. In still other embodiments, acoustic wave generator 540 can include a pulsed particle beam source, a piezoelectric device, or any other suitable custom or commercially available device, or device yet to be developed.

Acoustic wave generator 540 can be configured so as to produce a wide bandwidth of acoustic frequencies to enable sampling of the smallest defect size. Currently, pulsed lasers can generate significantly wider bandwidths than piezoelectric materials, which being more crystalline in nature can have a narrower band of excitation modes. The highest frequencies contained within the acoustic wave packet can sample the smallest defect size. The relationship of desired frequency to measure defect size is somewhat dependent on the speed of sound of the material. The ultrasonic wave generator 540 can be configured so as to place the excitation at a specific point at a known time (also referred to as the initial time). Currently, pulsed lasers can be focused to spot sizes <1 microns so as to induce an excitation event precisely in time and position. The energy flux of ultrasonic wave generator 540 can be selected so as to be sufficiently low as to avoid or reduce damage to the material. The particular energy flux suitably can be selected based on the material being irradiated, e.g., so as to deposit sufficient energy such that the material produces a thermoelastic response as opposed to ablating or melting. In embodiments in which there is a pulsed processing laser (that is doing ablation, cutting, melting, or milling, for example), the acoustic waves can be produced by the processing laser and the properties of the acoustic waves can be detected and analyzed for temperature induced stress and surface roughness.

Acoustic wave detector 550 can include any suitable device configured to detect an acoustic wave within material 520, e.g., responsive to a suitable command provided by controller 510. For example, in some embodiments, acoustic wave detector 550 can include a laser configured to generate a laser beam that irradiates the surface of material 520 and detects the arrival time or the disturbance amplitude, or both the arrival time and the disturbance amplitude, of an acoustic wave. Alternatively, acoustic wave detector 550 can include any suitable combination of hardware and software configured to detect an acoustic wave, such as a piezoelectric device, or any other custom or commercially available device or device yet to be developed. In some embodiments, a narrow band CW laser can be configured into a heterodyne surface displacement sensor to enable ultrasonic wave displacements on the order of an Angstrom. The ability to "sense" very small amplitude displacements can reduce the amount of power applied using ultrasonic wave generator 540.

In some embodiments, responsive to user input provided through input device 514, e.g., user input defining the material to be processed, the shape of the article to be formed, and any other suitable processing parameters, controller 510 requests database 515 to provide information on how to perform such processing. Responsive to the request, database 515 provides some or all of the following information to controller 510: the type of material to be processed; the precursor material to be used; parameters defining the flow or volume of precursor material to be used; the power and any focusing parameters of first energy source 530, second energy source 560, acoustic wave generator 540, and acoustic wave detector 550; and parameters defining implementation of relative movement between material and first energy source 530, second energy source 560, acoustic wave generator 540, and acoustic wave detector 550, e.g., a trajectory or path in x-y-z space of stage 521 or respective trajectories or paths in x-y-z space of first energy source 530, second energy source 560, acoustic wave generator 540, and acoustic wave detector 550. Controller 510 receives this information and stores it in memory 512. Processor 511 processes the stored information, and based on that information optionally displays instructions to the user via display device 513 and controls stage 520, first energy source 530, second energy source 560, acoustic wave generator 540, acoustic wave detector 550, elements 531, 561, 541, and 551, reaction chamber 590, and precursor source material 591 to process material 520 as appropriate.

For example, in some embodiments, controller 510 illustrated in FIG. 5 can be configured so as to control first energy source 530 so as to heat a region of material 520. Illustratively, memory 512 can store appropriate instructions for causing processor 511 to send an appropriate signal to first energy source 530, and optionally also to element 531, to cause first energy source 530 to emit energy at a suitable power, suitable duration, with suitable focus, and along a suitable path or trajectory towards material 520. In some embodiments, memory 512 can store appropriate instructions for causing processor 511 to send an appropriate signal to precursor material source 591 so as to cause precursor material source 591 to introduce an appropriate precursor material into reaction chamber 590. Memory 512 also can store appropriate instructions for causing processor 511 to send an appropriate signal to reaction chamber 590 to maintain the chamber at an appropriate pressure and temperature for material processing. Memory 512 also can store appropriate instructions for causing processor 511 to send an appropriate signal to stage 521 so as to move along an appropriate trajectory or path in x-y-z space. In one illustrative embodiment, under control of controller 510, first energy source 530 implements step 410 of method 400 described above with reference to FIG. 4.

Controller 510 illustrated in FIG. 5 further can be configured so as to control acoustic wave generator 540 so as to excite an acoustic wave in material 520. The acoustic wave can be transmitted through the heated region of the material, and the heated region of the material can change at least one property of the first acoustic wave in a manner such as provided elsewhere herein. Illustratively, memory 512 can store appropriate instructions for causing processor 511 to send an appropriate signal to acoustic wave generator 540, and optionally also to element 541, to cause acoustic wave generator 540 to excite an acoustic wave at an appropriate location of material 520. In embodiments in which acoustic wave generator 540 includes a pulsed laser or pulsed particle beam, memory 512 can store instructions for causing processor 511 to send an appropriate signal to acoustic wave generator 540, and optionally also to element 541, to cause acoustic wave generator 540 at a suitable power, with suitable focus, and along a suitable path or trajectory towards material 520. As noted above, in some embodiments, first energy source 530 also can perform the function of acoustic wave generator 540. For example, first energy source 530 can generate a pulsed laser beam or pulsed particle beam that both heats material 520 for processing and excites an acoustic wave in that material. The acoustic wave can include one or more of a surface acoustic wave, a bulk acoustic wave, a guided acoustic wave, and a phonon. In one illustrative embodiment, under control of controller 510, acoustic wave generator 540 (whether provided by first energy source 530 or provided as a discrete device) implements steps 420 and 430 of method 400 described above with reference to FIG. 4.

Controller 510 illustrated in FIG. 5 further can be configured so as to control acoustic wave detector 550 so as to detect the change in at least one property of the acoustic wave. Illustratively, memory 512 can store appropriate instructions for causing processor 511 to send an appropriate signal to acoustic wave detector 550 to cause acoustic wave detector 550 to detect the acoustic wave at an appropriate location of material 520. For example, the change in at least one property of the acoustic wave can include a change in an arrival time, a change in a disturbance amplitude or shape (e.g., profile) or changes both in the arrival time and the disturbance amplitude or shape, of at least one frequency component of the acoustic wave. In some embodiments, acoustic wave detector 550 can include a laser configured to emit a laser beam arranged to detect the change in the arrival time, the change in the disturbance amplitude, or the changes both in the arrival time and the disturbance amplitude, of the at least one frequency component of the acoustic wave based on receiving laser light reflected from material 520. Memory 512 can store appropriate instructions for causing processor 511 to send an appropriate signal to cause acoustic wave detector 550 to emit such a laser beam at a suitable power, with suitable focus, and along a suitable path or trajectory towards material 520, and to cause acoustic wave detector 550 to receive and properly analyze the laser light reflected by material 520. In other embodiments, acoustic wave detector 550 can be configured to detect the change in the arrival time, the change in the disturbance amplitude, or the changes both in the arrival time and the disturbance amplitude, of the at least one frequency component of the acoustic wave based on receiving the acoustic wave from material 520 using a piezoelectric device. In still other embodiments, acoustic wave detector 550 can be configured to detect the change in the arrival time, the change in the disturbance amplitude, or the changes both in the arrival time and the disturbance amplitude, of the at least one frequency component of the acoustic wave based on receiving a phonon emission from material 520, where such phonon emission is generated by the conversion of short pulse optical photons into phonons by the material. In one illustrative embodiment, under control of controller 510, acoustic wave detector 550 implements step 440 of method 400 described above with reference to FIG. 4.

Controller 510 illustrated in FIG. 5 further can be configured so as to characterize a temperature of material 520 in the heated region based on the detected change in at least one property of the acoustic wave. For example, memory 512 can store appropriate instructions for causing processor 511 to characterize the temperature of material 520 based on the change in the arrival time, the change in the disturbance amplitude, or the changes both in the arrival time and the disturbance amplitude, of at least one frequency component of the acoustic wave. Illustratively, memory 512 can include calibration information, a look-up table, or any suitable algorithm that when implemented by processor 511 facilitates characterization of the temperature. In one illustrative embodiment, controller 510 implements step 450 of method 400 described above with reference to FIG. 4. Optionally, controller 510 further can be configured to characterize a defect in a morphology of the material in the heated region based on the detected change in at least one property of the acoustic wave, in a manner such as provided elsewhere herein.

Controller 510 illustrated in FIG. 5 further can be configured so as to compare the characterized temperature of material 520 in the heated region to a threshold. For example, memory 512 can store a threshold defining a temperature at or above which the material can be properly processed, and appropriate instructions for causing processor 511 to compare the characterized temperature to that threshold. In one illustrative embodiment, controller 510 implements step 460 of method 400 described above with reference to FIG. 4.

Controller 510 illustrated in FIG. 5 further can be configured so as to, based on the characterized temperature of material 520 in the heated region being less than the threshold or being above the threshold for an insufficient amount of time, control second energy source 560 so as to modify a property of the heated region, e.g., so as to heat the heated region of material 520 to a temperature above the threshold. For example, memory 512 can store instructions for causing processor 511 to send an appropriate signal to second energy source 560, and optionally also to element 561, to cause second energy source 560 to emit energy at a suitable power, suitable duration, with suitable focus, and along a suitable path or trajectory towards material 520. In one illustrative embodiment, controller 510 implements step 470 of method 400 described above with reference to FIG. 4. Optionally, controller 510 further can be configured to, based on a characterized defect, control second energy source 560 so as to heat the heated region of material 520 to a temperature above the threshold.

Optionally, system 500 can include any suitable number of acoustic wave generators and acoustic wave detectors configured so as to monitor temperature or morphology at any suitable number of regions of material 520. For example, system 500 optionally can include a second acoustic wave generator and a second acoustic wave detector (not specifically shown). Controller 510 can be coupled to the second acoustic wave generator and the second acoustic wave detector and configured so as to control the second acoustic wave generator so as to excite a second acoustic wave in material 520, the second acoustic wave being transmitted through a heated second region of material 520, the heated second region of material 520 changing at least one property of the second acoustic wave in a manner analogous to that provided elsewhere herein. Controller 510 further can be configured so as to control the second acoustic wave detector so as to detect the change in at least one property of the second acoustic wave in a manner analogous to that provided elsewhere herein. Controller 510 further can be configured so as to characterize a temperature of material 520 in the second region based on the detected change in at least one property of the second acoustic wave in a manner analogous to that provided elsewhere herein. Controller 510 further can be configured so as to compare the characterized temperature of material 520 in the heated second region to a threshold in a manner analogous to that provided elsewhere herein. Controller 510 further can be configured to, based on the characterized temperature of material 520 in the heated second region being less than the threshold or being above the threshold for an insufficient amount of time, control second energy source 560 or a third energy source (not specifically illustrated, but can be configured analogously as first energy source 530 or second energy source 560) so as to modify a property of the heated second region of material 520, e.g., so as to heat the heated second region of material 520 to a temperature above the threshold. Those of skill in the art will appreciate that the controller, the energy and detector sources suitably can be configured so as to enable multiple detecting sources on material 520 for a single acoustic wave source and to detect excitation on material 520 from multiple energy sources.

Those of skill in the art will appreciate that any of the user-performed steps may alternatively be automated using commercially available equipment (not illustrated). For example, in certain industrial applications, a process script profile may be provided that controls precursor material source 590, reaction chamber 590, first energy source 530, second energy source 560, acoustic wave generator 540, acoustic wave detector 550, elements 531, 541, 551, and 561, stage 521, relative motion, and timing.

Accordingly, it should be understood that certain embodiments of the present systems and methods can utilize changes (e.g., arrival time, pulse shape, or frequency distribution) that occur to a propagating surface acoustic wave packet produced by a pulsed laser to derive the value of the surface temperature and morphology, e.g., surface roughness, over the area where the waves have propagated. Information suitably can be obtained from one or more different types of acoustic waves, including but not limited to surface acoustic waves, or SAWs, that can be excited and transmitted along the surface of a material.

For example, at moderate pulsed laser fluences (J/cm$^2$), a material can be expected to respond in a thermoelastic manner. Such a response can generate displacement waves that travel in the bulk and along the surface at the speed of sound. Dispersion issues aside, waves that propagate along the surface can be expected to be transmitted more slowly than waves traveling in the bulk. With fast (GHz) signal digitization, the bulk and surface waves can be separated from one another in time, given a reasonable propagation length. Both bulk and surface waves can be expected to be sensitive to the material temperature. In particular to the surface waves, the bandwidth of the generated displacement waves is inversely proportional to the laser pulsewidth (e.g., 1 ns laser pulsewidth can be expected to yield a SAW wavepacket including frequencies up to 1 GHz). Consequently, the shorter the laser pulse, the wider is the acoustic bandwidth. Mathematically, the speed of sound in a material can be related to the material bulk modulus (e.g., stiffness, elasticity) and the density. Both of these properties depend on the temperature, but experiments have shown that for metals the speed of sound slows down with increasing temperature and this change can be calibrated for a given material. For further details regarding temperature dependent characteristics of certain materials, see the following references, the entire contents of each of which are incorporated by reference herein: Varshni, "Temperature dependence of elastic constants," Physical Review B 2(10): 3952-3958 (1970); Hubert et al., "Contactless ultrasonic device to measure surface acoustic wave velocities versus temperature," Review of Scientific Instruments 78: 024907-1 to 024907-6 (2007); and Nadal et al., "Continuous model for the shear modulus as a function of pressure and temperature up to the melting point: Analysis and ultrasonic validation," Journal of Applied Physics 93(5): 2472-2480 (2003).

Figure 7:
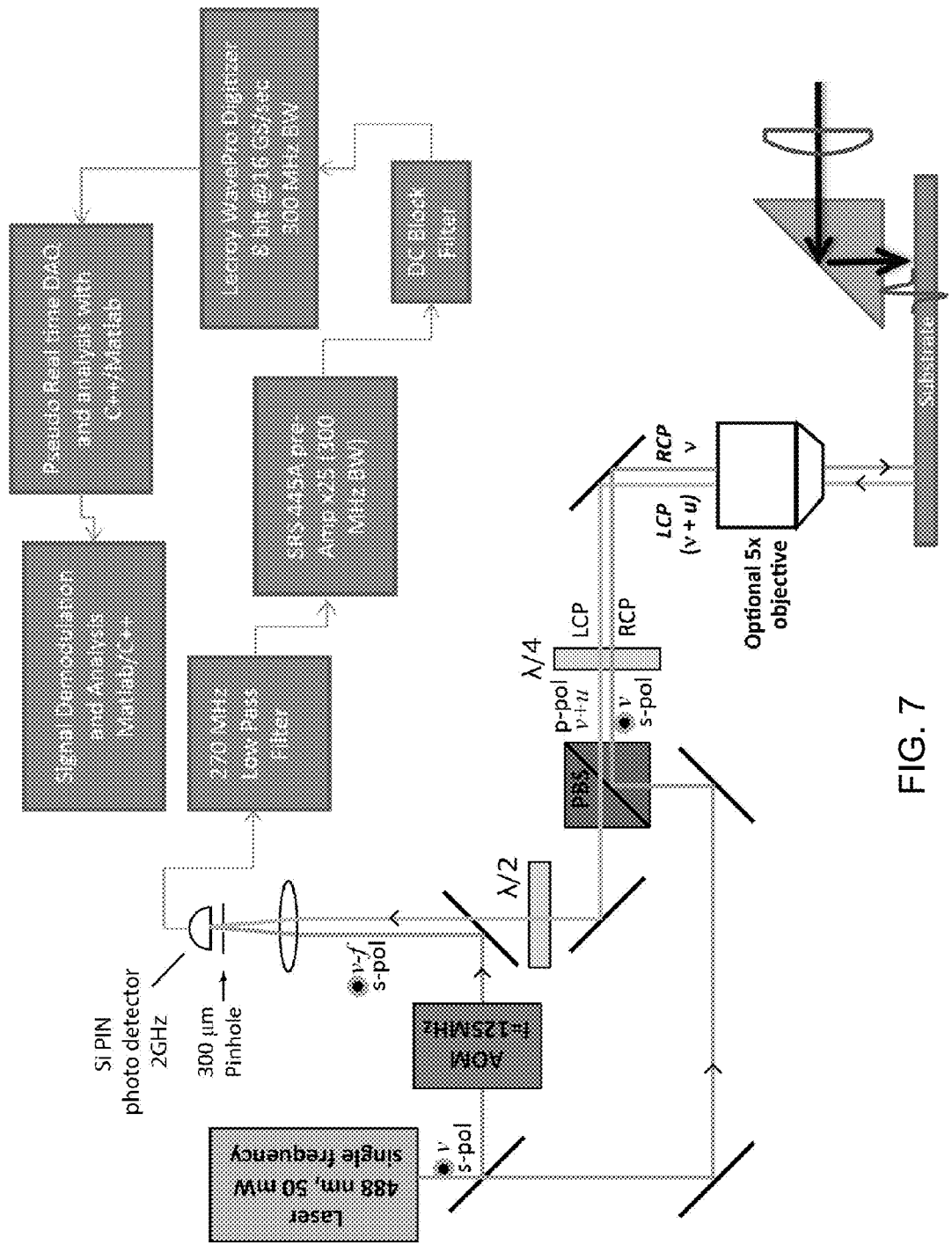
FIG. 7 illustrates another exemplary system for monitoring temperature using acoustic waves during processing of a material, according to some embodiments.

Note that the change in acoustic velocity as a function of temperature can be on the order of a few percent, and that modern electronics data acquisition technology facilitate measuring the resulting change in the arrival time of the acoustic wave. The present systems and methods can use such a change in the arrival time as monitor of the temperature of the region traversed by the wave. In some embodiments, a propagating acoustic wave, such as a SAW, can be detected using an optical interferometer (acoustic wave detector) with sensitivity <1 nm. In other embodiments, a propagating acoustic wave, such as a SAW, can be detected using a laser-based heterodyned acoustic wave detector in a manner analogous to that described in Manzo et al., "Application of a laser heterodyne technique to characterize surface acoustic waves generated by a pulsed laser," Proc. of SPIE 8967: 89670N-1 to 89670N-7 (2014), the entire contents of which are incorporated by reference herein. Heterodyning mixes the desired information (signal) on a carrier wave that is at a frequency far removed from nominal electrical noise frequencies. Prior to the digital era, nearly all modern radios and TVs operated on this principle. The same principle can be applied to an optical interferometer that is driven by a narrow bandwidth laser. The result is a frequency modulated laser beam that upon touching a surface will imprint the surface displacements (i.e. vibrations) as an additional time varying phase shift onto the modulated optical carrier. The reflected laser is then made to impinge on a fast photodiode detector along with a reference (unmodulated) wave. The beat frequency from the two waves is digitized by a transient recorder and by analysis, the time resolved signal is demodulated and the surface displacement information extracted. FIG. 7 illustrates another exemplary system for monitoring temperature using acoustic waves during processing of a material, according to some embodiments. More specifically, FIG. 7 illustrates one non-limiting example of a heterodyned acoustic wave detector that suitably can be used in the present systems and methods to detect acoustic waves and the changes thereof.

In one non-limiting example, two lasers are used in close proximity (a few mm separation) to an AM build zone area (typically 500 microns dia.); the first, pulsed laser "taps" the surface to launch the acoustic wave packet, and the second, continuous laser (CW) is configured as a heterodyne displacement sensor which measures the arrival time and changes in the wave packet. Analysis of the signal from the heterodyne detector yields information such as the local temperature (e.g., the absolute temperature if the system is calibrated) and morphology, e.g., surface roughness (if the system is calibrated). The exemplary embodiment can include the two lasers and the optics to deliver the beams to the desired areas, a fast photodiode detector (e.g., having GHz bandwidth), a fast transient digitizer (e.g., sampling at GSamples/sec) and computer code (such as, but not limited to, MATLAB written code) that analyses the signals generated by the acoustic wave. Without wishing to be bound by any theory, it is believed that even with research laboratory instrumentation, the analysis can be done to maintain build speeds of 50 mm/sec or higher. It is anticipated that with appropriate ASICs (or application specific integrated circuits) or other signal monitoring integration devices (e.g., "boxcar time signal integrator") the analysis can be further expedited.

Figure 6:
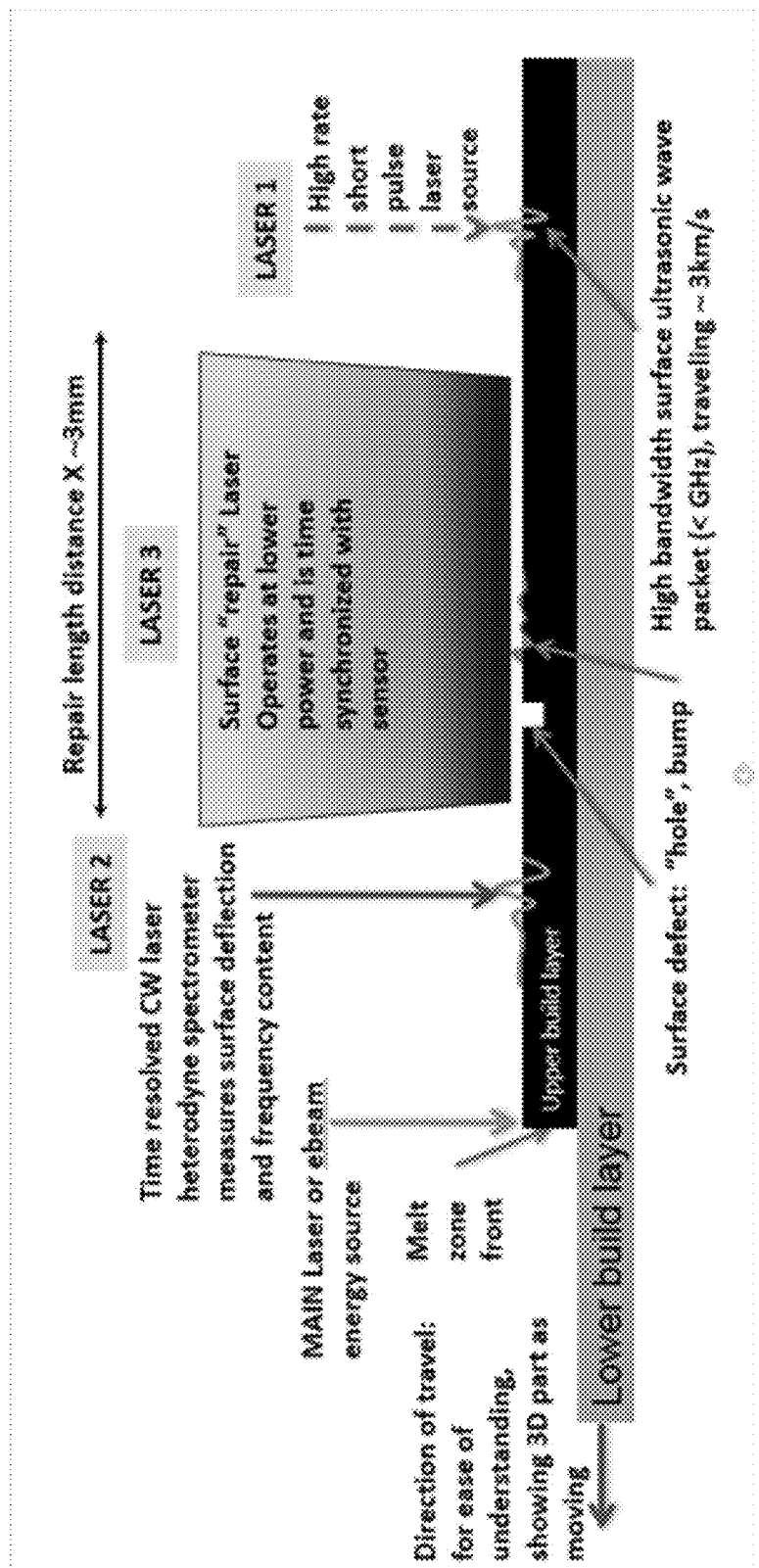

FIG. 6 schematically illustrates steps during another exemplary method for monitoring temperature using acoustic waves during processing of a material, according to some embodiments. More specifically, FIG. 6 shows a schematic of one exemplary system as it would be implemented in an AM tool. A build layer is shown (black) with a melt-zone front above a lower layer (grey) that is propagating to the left. The schematic also shows a "just made" defect (e.g., hole). Some distance behind the melt-zone front, a short pulse (<10 ns) laser (Laser 1) excites SAWs at a desired repetition rate, e.g., at a high repetition rate. SAW packets emanate travelling in both directions at a velocity depending on the material, e.g., approximately 3-4 km/sec for metals. The left propagating packet traverses over the hole and some wavelengths are scattered; note that based upon the hole is sufficiently large, there can be significant reflection. The un-scattered wave packet is then sensed by Laser 2, which can be configured as a heterodyned acoustic wave detector such as illustrated in FIG. 7. Information from the acoustic wave detector is sent to a controller, which controls Laser 3 to fire and re-melt/smooth the hole. Identified as Laser 3 in FIG. 6 is one possible implementation of a corrective action laser (e.g., second energy source) which modifies or repairs the surface based on data from the acoustic waves. The configuration to measure surface temperature at the melt zone can have Laser 1 and Laser 3 physically rotated by 90 degrees (e.g., arranged in and out of this paper). The embodiment illustrated in FIG. 6 can be implemented as an all optical scheme, thus facilitating integration into existing AM tooling.

Figure 8A:
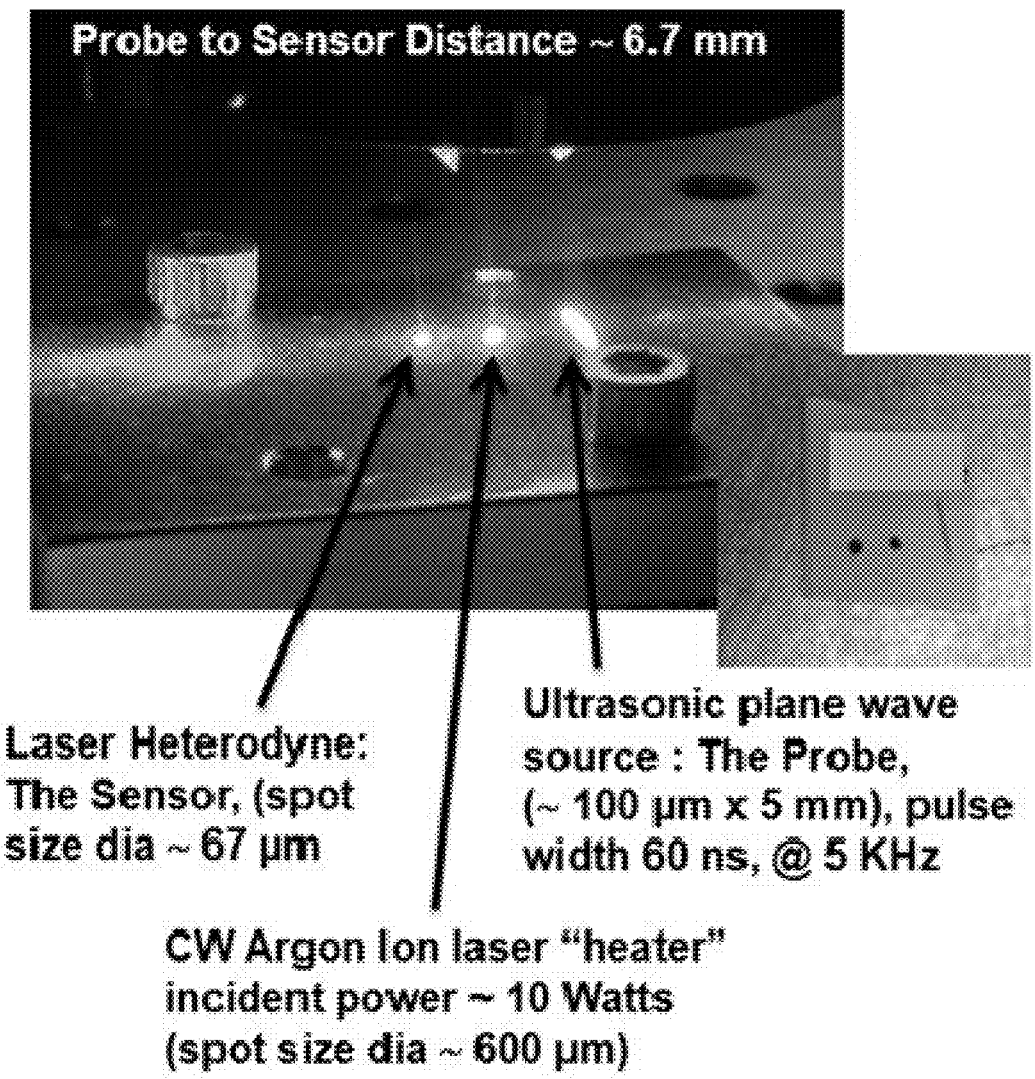
FIG. 8A illustrates an image obtained during one non-limiting example of a method for monitoring temperature using acoustic waves during processing of a material, according to some embodiments.

In some embodiments, the acoustic wave generator (e.g., Laser 1 illustrated in FIG. 6, or acoustic wave generator 540 illustrated in FIG. 5) can be selected so as to have an optical wavelength that is optically absorbed by the material to be processed. For example, for metals, optical wavelengths in the ultraviolet range (e.g., 355 nm) can be absorbed relatively strongly, while optical wavelengths of 1064 nm or 532 nm can be relatively economical to generate. In some embodiments, the acoustic wave detector (e.g., Laser 2 illustrated in FIG. 6, or acoustic wave detector 550 illustrated in FIG. 5) can include a heterodyned continuous wave laser that is narrowband (<1 MHz, e.g., at a 488 nm optical wavelength) and configured in a manner such as described in Manzo et al., cited above, or such as illustrated in FIG. 7. In one non-limiting example, the acoustic wave generator can be focused by a cylindrical lens to form a line (approx. 5 mm in length) while the acoustic wave detector, e.g., laser at 488 nm is focused to a spot somewhat removed from the line source. The line exposure generates a plane SAW that emanates in both directions (FIG. 6) with the acoustic wave traveling toward the acoustic wave detector being the one of interest. FIG. 8A illustrates an image obtained during one non-limiting example of a method for monitoring temperature using acoustic waves during processing of a material, according to some embodiments. More specifically, FIG. 8A shows a photograph of the laser exposure layout of FIG. 6, separated in distance to make photography easier. The image shows the acoustic wave generator (or "probe," corresponding to Laser 1 in FIG. 6) on the right. On the left is the acoustic wave detector (laser heterodyne "sensor" focused to a spot, corresponding to Laser 2 in FIG. 6). The laser spot in the middle is used to heat the sample for the proof-of-concept demonstration. In one configuration, the laser spot in the middle alternatively could represent a remediation laser (e.g., corresponding to Laser 3 in FIG. 6).

In one example, the present systems and methods can utilize a fast (approx. >1 GHz bandwidth) photodiode detector and suitable optics to deliver both laser beams to the surface and capture the reflected light of the sensor beam. The beat signal from the photodiode can be amplified and then digitized at high speed (e.g., 4-16 Gsamples/sec). Signal analysis software written in MATLAB (The Math-Works, Inc., Natick, Mass.) can be used to demodulate the digitized signal and extract the arrival times and disturbance amplitudes of the acoustic waves. FIGS. 9A and 9B illustrate displacements measured during the example shown in FIG. 8A and schematically depicted in FIG. 8B, according to some embodiments, e.g., measured data demonstrating the ability to measure surface temperature change. Both FIGS. 9A and 9B show displacement versus time plots. FIG. 9B illustrates three traces in which the heating laser (identified in FIG. 8A, 8B) is OFF and the surface temperature is at room temperature but SAW is measured at the heterodyne sensor location. The data illustrated in FIG. 9A also include a displacement versus time plot showing two traces of the measured SAW at the heterodyne sensor location. The bottom trace is at room temperature while the top trace shows when the surface is heated by the middle laser shown in FIG. 8A. The Y axis in FIGS. 9A and 9B (displacement in $10^{-9}$ m) refer to the bottom traces. The multiple traces in FIG. 9B are intended to show repeatability. A line is drawn to guide the eye. In this example, the material is copper. A measurable delay in the SAW arrival time can be seen in FIG. 9A based on the top trace as compared to the bottom trace. In this example, the displacement resolution is about 0.2 nm with S/N of about 2-3. The estimated (not calibrated) temperature rise in this example is 275° C. which is based on data from the temperature dependence of the shear modulus of polycrystalline copper, obtained from Tokiy et al., "Temperature dependence of elastic moduli of submicrocrystalline copper," Physics of the Solid State 56(5): 1002-1005 (2014), the entire contents of which are incorporated by reference herein. In this example, the resolution limit of monitoring temperature change, for this alloy, is estimated about 100° C., which can be expected to be sufficient for AM manufacturing. Higher resolution can be provided by employing higher precision instrumentation.

Figure 8B:
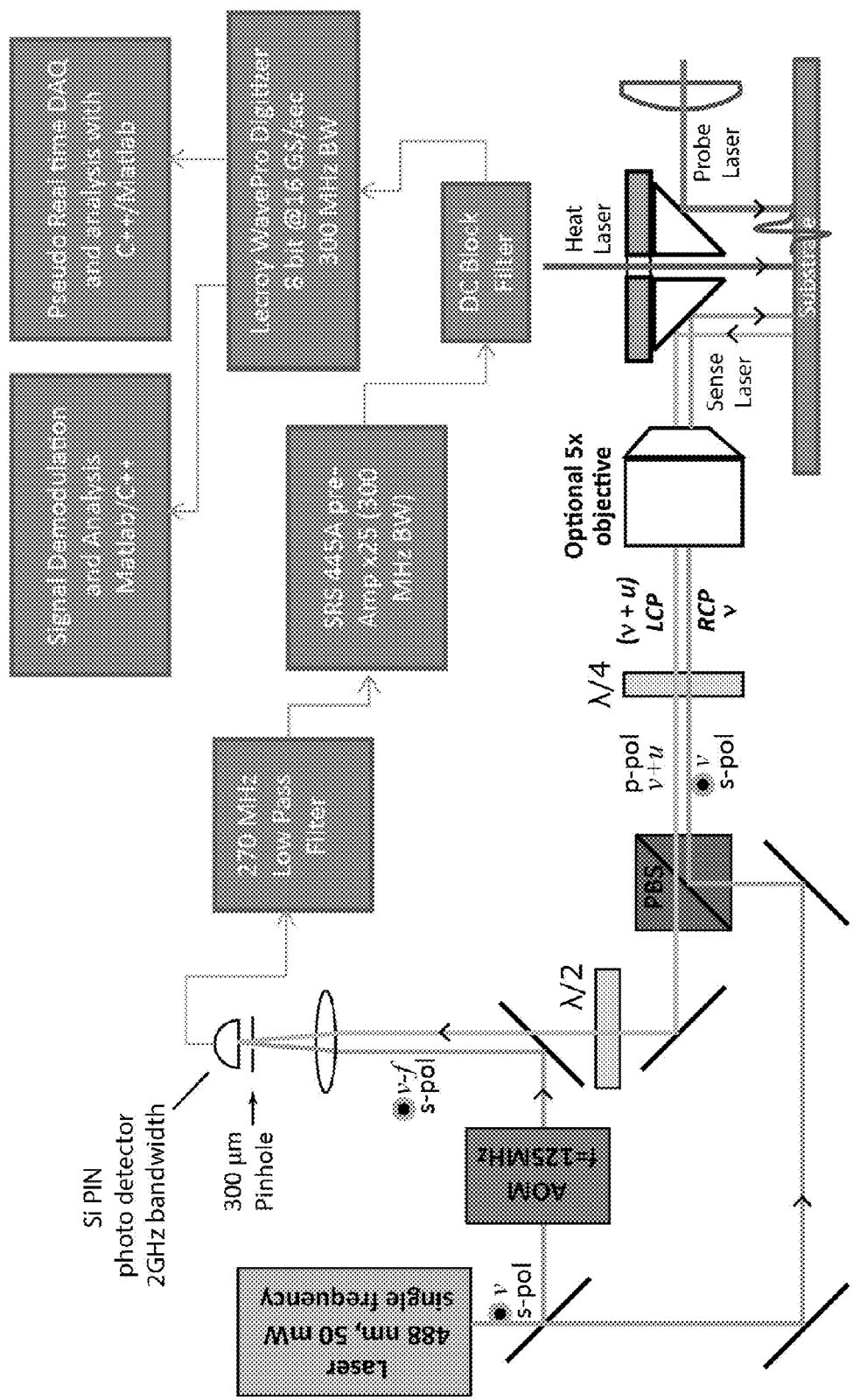
FIG. 8B illustrates another exemplary system for monitoring temperature using acoustic waves during processing of a material, according to some embodiments.
Figure 9A:
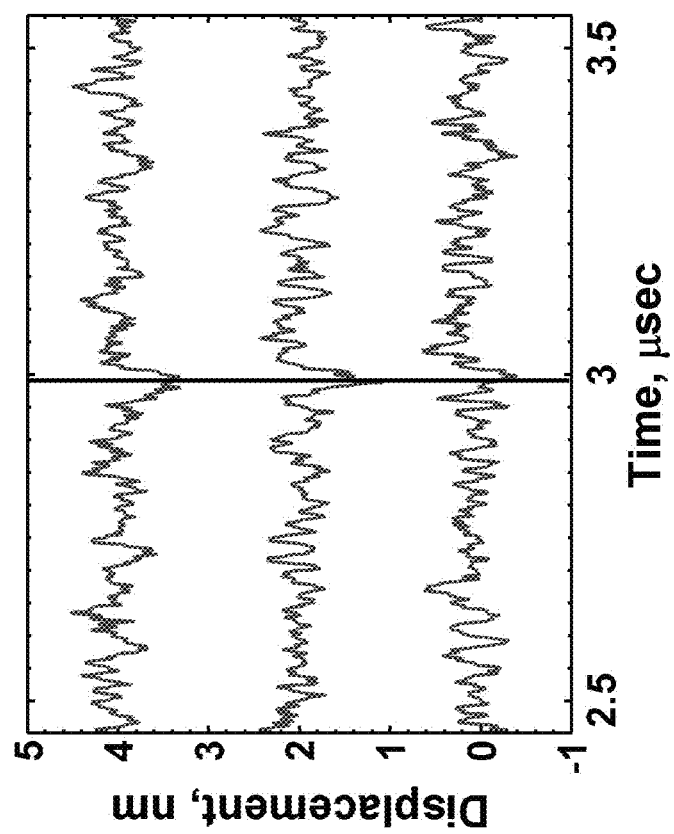
FIG. 9A illustrates displacements measured during the example of FIG. 8A using the system of FIG. 8B, according to some embodiments.
Figure 9B:
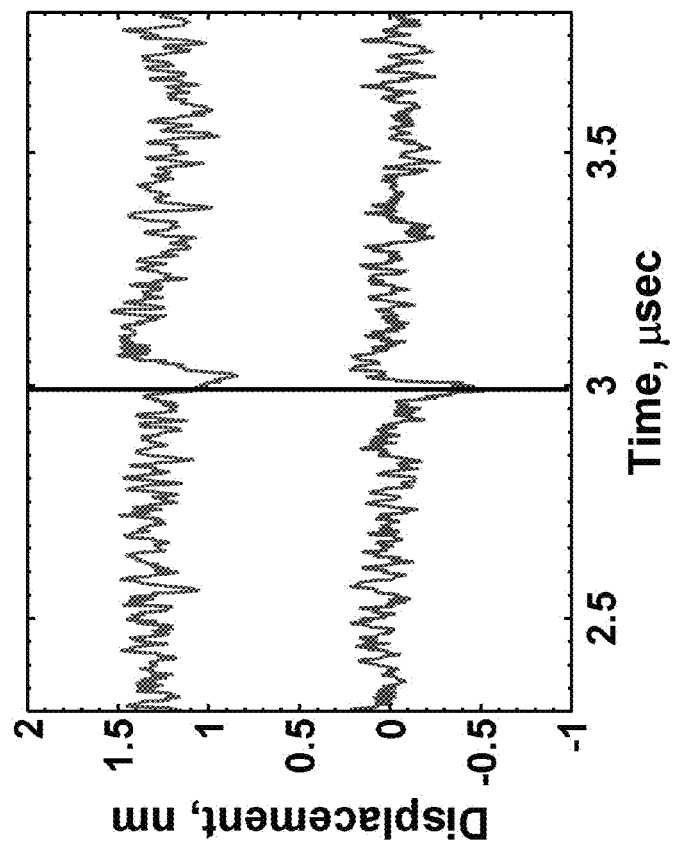
FIG. 9B illustrates additional displacements measured during the example of FIG. 8A using the system of FIG. 8B, according to some embodiments.
Figure 9C:
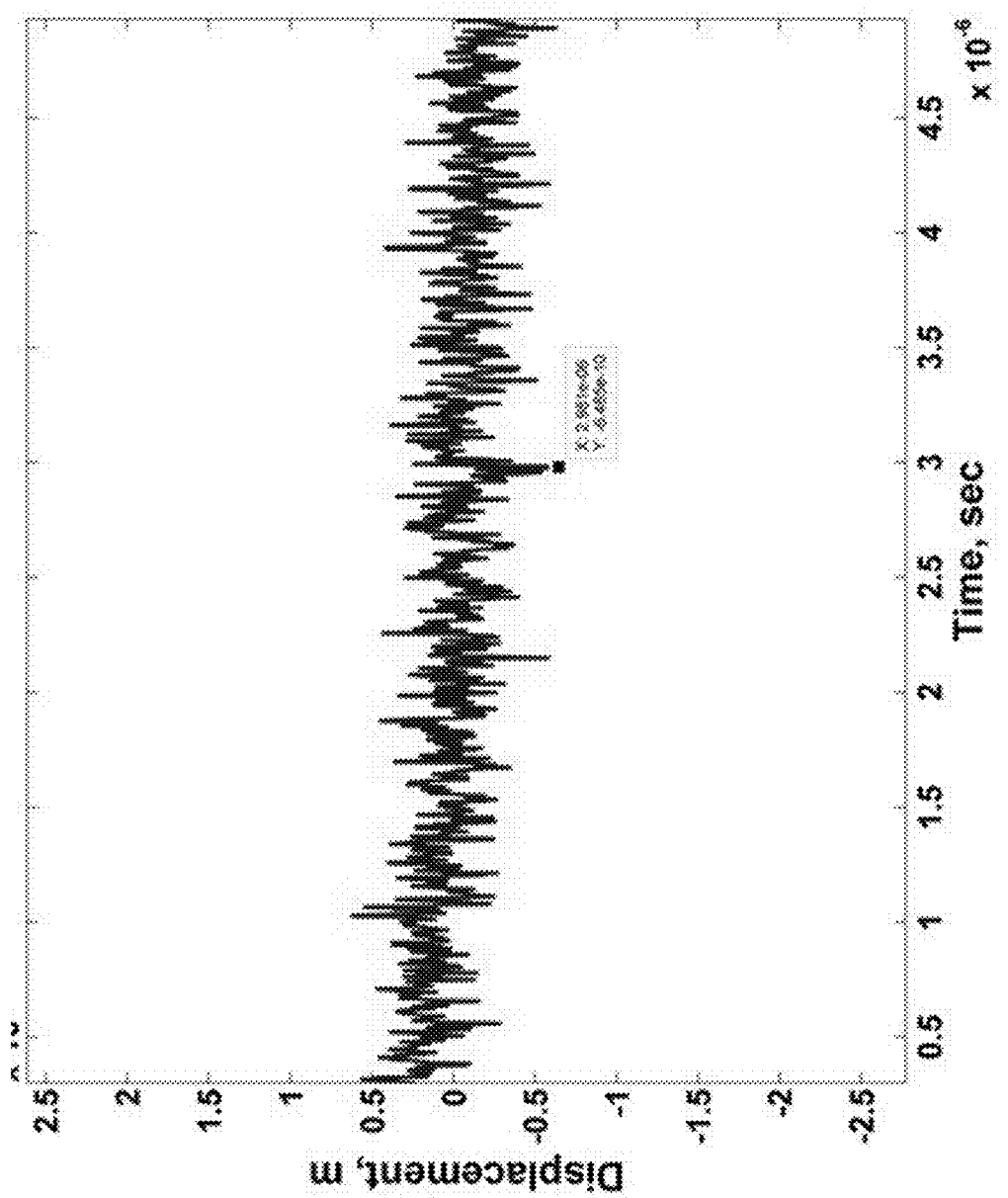
FIG. 9C illustrates additional displacements measured during the example of FIG. 8A using the system of FIG. 8B, according to some embodiments.

FIG. 9C illustrates additional displacements measured during the example of FIG. 8A using the system of FIG. 8B, according to some embodiments. More specifically, FIG. 9C shows a sum of 579 traces of displacement vs. time data sequentially taken with the SAW laser firing at 5 kHz. The ability to capture data at this rate (1 per 200 microseconds) demonstrates that the present systems and methods can process acoustic wave information at a sufficient rate to keep up with a very high build speed in an AM process. For example, based on a build speed of 50 mm/sec, the data of FIG. 9C are believed to demonstrate that it is possible to document the local temperature every 10 microns: a significant step toward temperature mapping of the complete build with 10 micron resolution. It can be expected that improved instrument-to-instrument data transfer rates with dedicated chip-based computational analysis can even further increase data acquisition rates.

Figure 10:
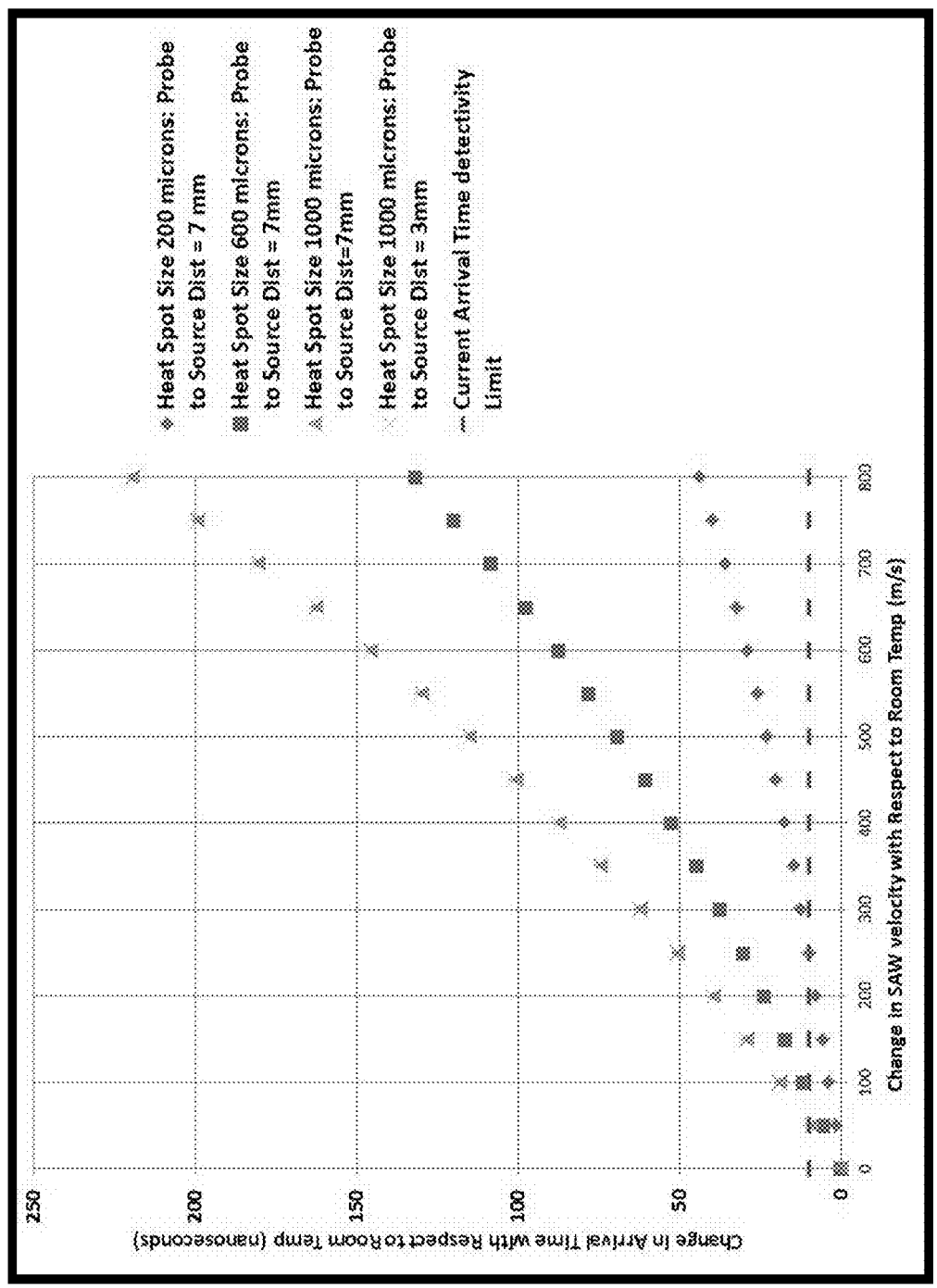
FIG. 10 illustrates a plot of exemplary changes in arrival time as a function of changes in surface acoustic wave velocity for different spot sizes and different distances between material heating and surface acoustic wave generation, according to some embodiments.

FIG. 10 illustrates a plot of exemplary changes in the expected arrival time as a function of changes in surface acoustic wave velocity for different heating spot sizes and different distances between material heating and surface acoustic wave generation, according to some embodiments. More specifically, FIG. 10 illustrates the calculated change in arrival time during the example of FIGS. 8A and 8B. It can be understood from FIG. 10 that for a given distance between material heating ("source") and acoustic wave generation ("probe"), that with increasing change in the SAW velocity there is a commensurate change in the arrival time as a function of heat spot size. Because increase in temperature typically reduces the SAW velocity, the larger the change, the larger the increase in arrival time that can be expected. For example, the changes in SAW arrival time can be seen to be lower in the data obtained using a heat spot size of 200 microns and a separation distance of 7 mm than in the data obtained using a heat spot size of 600 microns and the same separation distance. Additionally, the changes in SAW arrival time can be seen to be lower in the data obtained using a heat spot size of 600 microns and a separation distance of 7 mm than in the data obtained using a heat spot size of 1000 microns and the same separation distance. It also can be understood from FIG. 10 that the heat spot size and the distance between material heating and acoustic wave generation can play a role in the expected change in the SAW arrival time with varied weighting factors. For example, the changes in SAW arrival time can be seen to be approximately the same in the calculated result obtained using a heat spot size of 1000 microns and a separation distance of 7 mm than in the data obtained using a heat spot size of 1000 microns and a separation distance of 3 mm. The calculations in FIG. 10 are intended as a guide for exemplary measurement settings for a given material and laser heat spot size.

Figure 11:
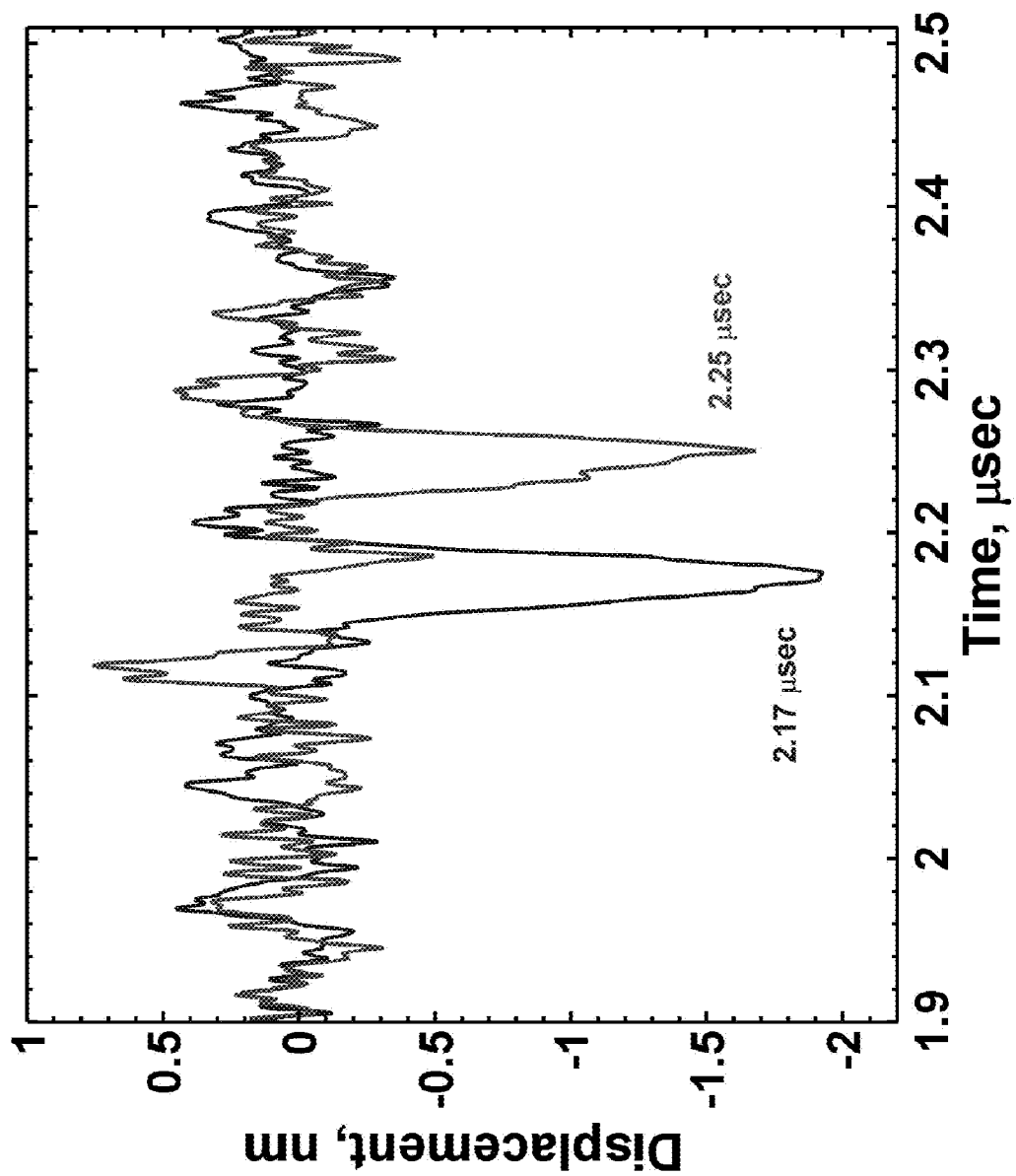
FIG. 11 illustrates plots of displacements measured during another non-limiting example of a method for monitoring temperature using acoustic waves during processing of a material, according to some embodiments.

FIG. 11 illustrates a plot of displacements measured during another non-limiting example of a method for monitoring temperature using acoustic waves during processing of a material, according to some embodiments. The trace with the earlier displacement arriving at nominal 2.17 microseconds is for a temperature of 150° C., while the trace with the later displacement arriving at 2.25 microseconds is for 200° C. More specifically, FIG. 11 illustrates acoustic displacements measured during an example similar to that described above with reference to FIGS. 8A-8B but in which the material was aluminum 6061 alloy instead of copper, and in which heat was applied using a static heater rather than with a laser. Based on the plot illustrated in FIG. 11, it can be understood that the acoustic wave had a disturbance amplitude of approximately 1.9 nm at a temperature of 150° C., and it can be understood that the acoustic wave had a disturbance amplitude of approximately 1.7 nm at a temperature of 200° C. Accordingly, it can be understood that the disturbance amplitude of an acoustic wave can be a function of temperature of the material through which that acoustic wave is transmitted. While the disturbance amplitude can be a function of temperature providing other materials information, FIG. 11 shows the change in the arrival time which marks the change in temperature.

Figure 12:
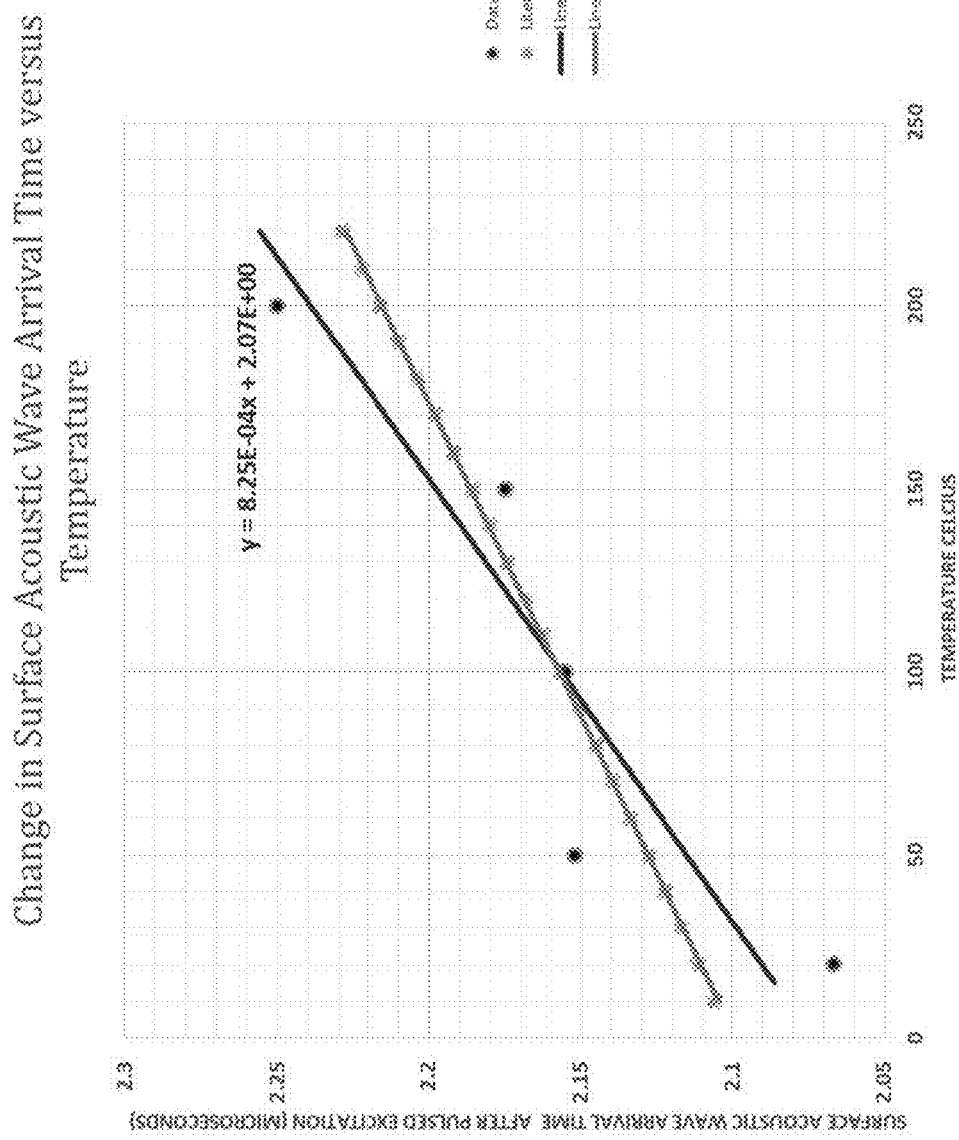
FIG. 12 illustrates a plot of change in surface acoustic wave arrival time as a function of temperature during another non-limiting example of a method for monitoring temperature during acoustic waves during processing of a material, according to some embodiments.

FIG. 12 illustrates a plot of change in surface acoustic wave arrival time as a function of temperature during another non-limiting example of a method for monitoring temperature during acoustic waves during processing of a material, according to some embodiments. More specifically, the experimental data illustrated in FIG. 12 was prepared using the example of FIG. 11, by statically heating aluminum 6061 alloy. FIG. 12 also includes literature data obtained from Christman et al., "Measurements of Dynamic Properties of Materials Volume III 6061-T6 Aluminum Final Report," Report DASA 2501-3, 159 pages (1971), the entire contents of which are incorporated by reference herein. As can be seen in FIG. 12, the arrival time of the SAW after pulsed excitation was measured to increase as a function of temperature similarly as reported in Christman. FIG. 12 also shows how a calibration experiment is conducted by measuring the change in the arrival time of a SAW as a function of temperature in a well calibrated oven to obtain the relationship between speed of sound and temperature over a relevant temperature range.

Figure 13:
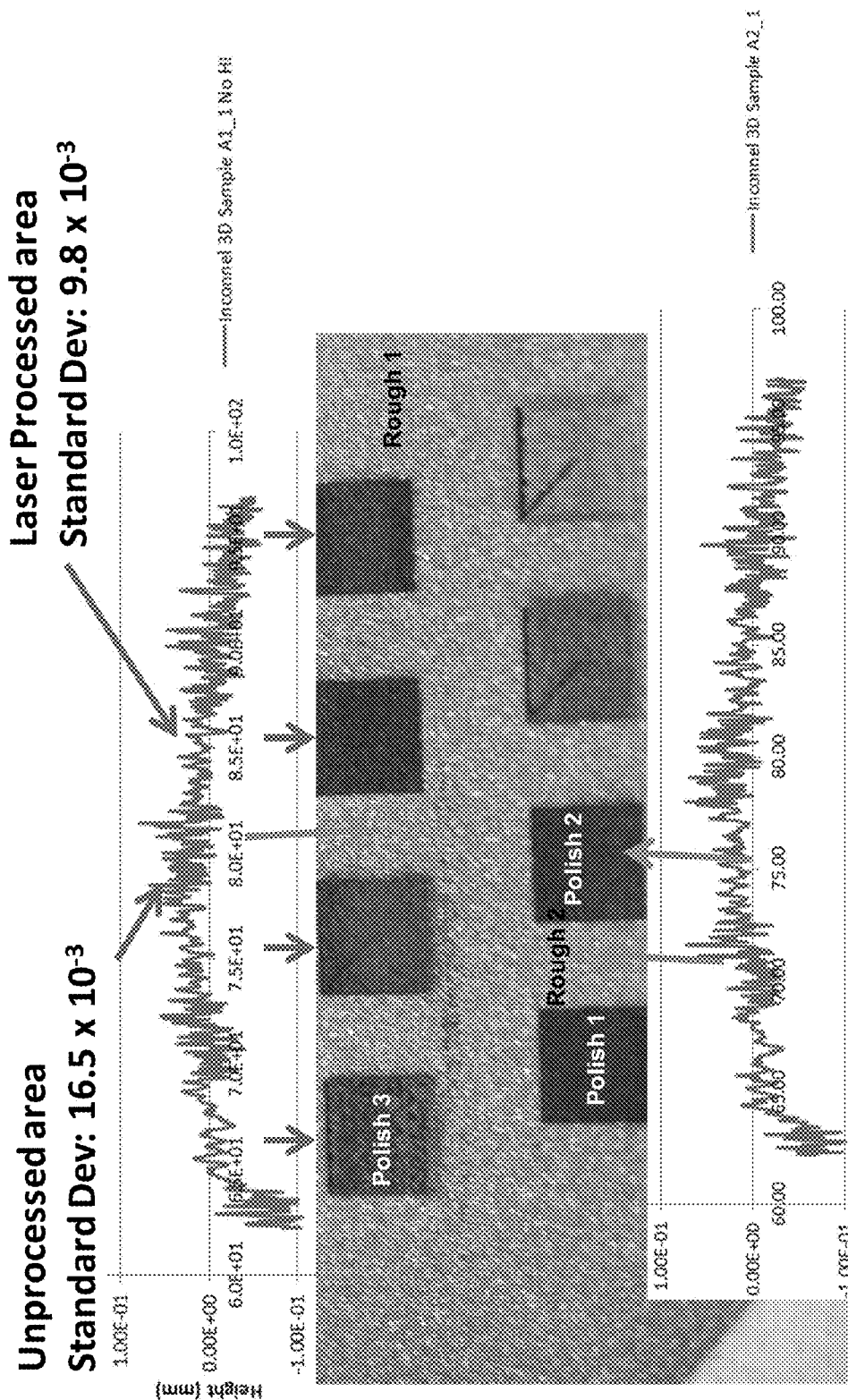
FIG. 13 illustrates images of materials and plots of surface topology (i.e. surface height) and modifications measured during another non-limiting example of a method for monitoring temperature using acoustic waves during processing of a material, according to some embodiments.
Figure 14:
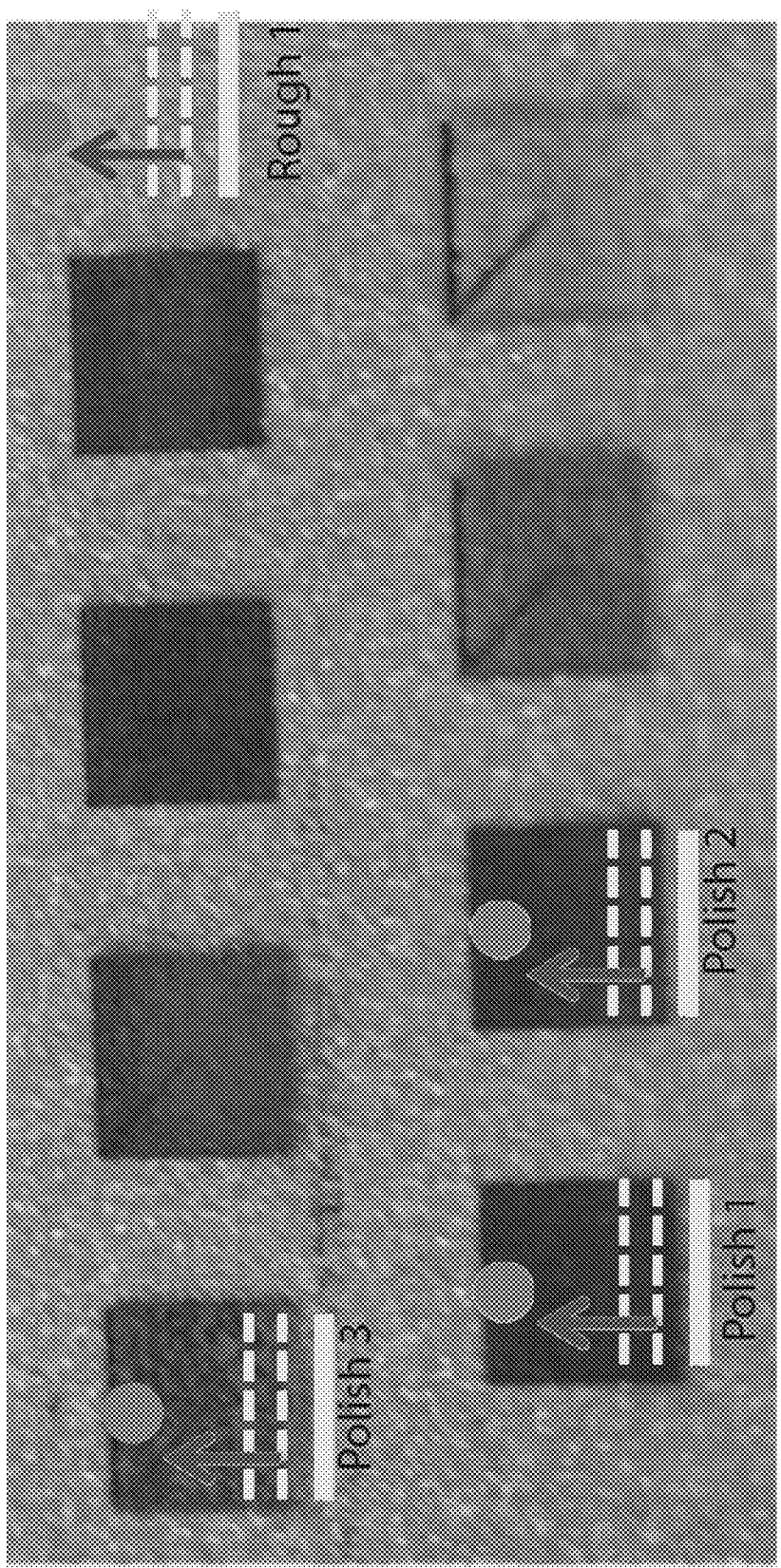
FIG. 14 illustrates images of materials during another non-limiting example of a method for monitoring temperature using acoustic waves during processing of a material, according to some embodiments.
Figure 15A:
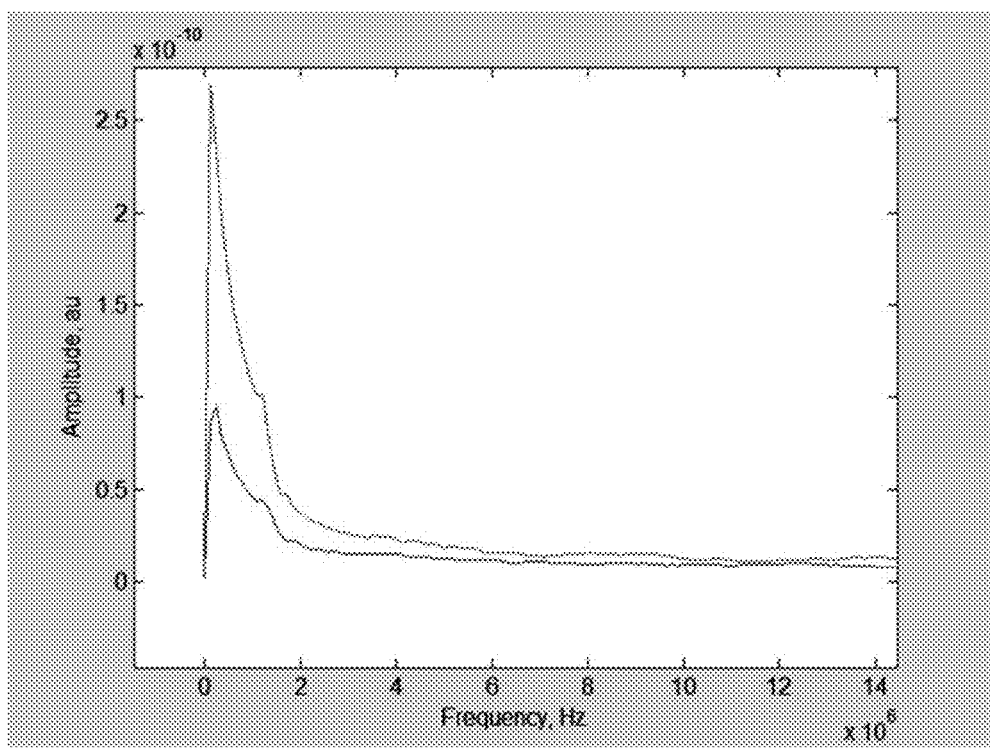
FIGS. 15A-15B illustrate plots of acoustic frequency spectra measured during another non-limiting example of a method for monitoring temperature using acoustic waves during processing of a material, according to some embodiments.
Figure 15B:
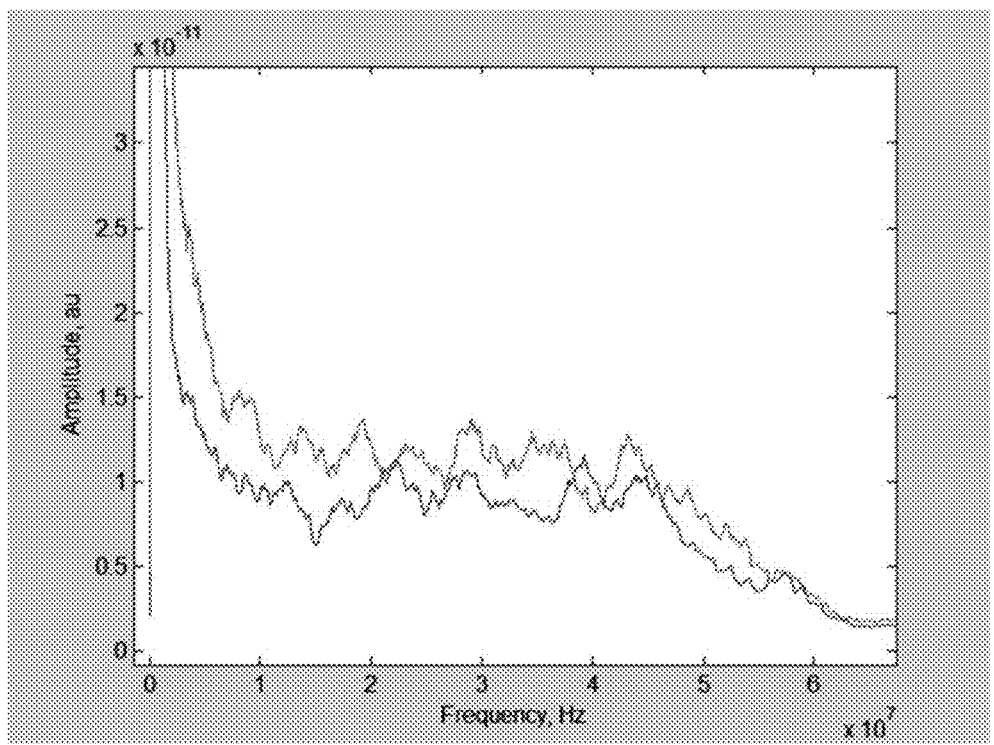

FIGS. 13-15B present experimental evidence in one embodiment of the ability of the laser heterodyne sensor to measure surface roughness by frequency analysis. FIG. 13 illustrates an optical photograph of an AM produced part (Inconel) that has been somewhat smoothed by laser polishing. The AM produced material is silver in tone and two regions are labeled (Rough 1 and Rough 2). The laser smoothed regions in the photograph have a darker tone and square in pattern. Three regions (polish 1, 2 and 3) are labeled. The different smoothed regions employed different laser "polishing" parameters. The two traces (top and bottom) are measurements from a commercial contact surface profilometer (Taylor/Hobson TalySurf). The scans were done from left to right through all the squares. Analysis of the data shows that the unprocessed area (no polishing) has a "roughness" standard deviation of 16.5 µm and this is somewhat reduced to 9.8 µm in the laser processed areas. FIG. 14 shows four measurement locations in which the laser heterodyne sensor coupled with the acoustic wave generator source was tested. The dot marks the location of the laser heterodyne sensor while the line marks the source of the acoustic wave (the dotted lines are to merely guide the eye). FIG. 15A presents data of the measured SAW wave in two locations (the rough and polished). The data is not presented in the time domain (which would be used to measure temperature) but in frequency domain (via MATLAB FFT algorithm). The lower data traces correspond to the rough area are while the upper data traces correspond to the polished area. The data show that there is more signal attenuation while traversing a rough area versus a polished area. FIG. 15B presents an expanded scale of the data in FIG. 15A to show the relative attenuation of frequency bands. Because frequencies correlate with acoustic wavelength and wishing to not be bound by any theory, it is believed that the scattering of a particular acoustic wavelength is dependent on the size of the scattering medium (e.g., defect). For example, for a defect size D and acoustic wavelength, $\Lambda$, for $(D\sim\Lambda\Lambda)$ the attenuation can be expressed as $D/\Lambda^2$. Consequently it is possible to convert the data shown in FIG. 15B into plot showing which scattering centers were annealed (e.g., removed) by this polishing step.

Accordingly, the present systems and methods can provide a process monitoring tool that can measure material temperature, material roughness, or both material temperature and material roughness at a sufficiently fast time scale to allow for remedial action, e.g., application of second energy source 560 illustrated in FIG. 5 or Laser 3 illustrated in FIG. 6. In some embodiments, the present systems and methods can be implemented as an all optical process monitoring scheme with the consequence that it could be integrated into any suitable type of material processing tool, e.g., AM manufacturing tool, without the need for significant modifications to the tool. In embodiments that include lasers for acoustic wave generation or detection, such lasers can be directed to any suitable location in the build, not necessary fixed to the build location. For example, by exciting acoustic waves utilizing a pulsed laser that is in close proximity to an optical based acoustic wave detector, high frequency SAWs (e.g., having frequency components of up to 500 MHz to 1 GHz, or acoustic wavelengths of about 5 to 10 µm) can be used to gain information on the local microstructure from measured scattering phenomena. Additionally, if there is a desire to probe the material at longer wavelengths (e.g., deeper into the build), then the bandwidth of the acoustic wave readily can be changed, e.g., by alter the focal spot size or the laser pulse width. Other embodiments can use piezoelectric devices, e.g., piezoelectric transducers, for acoustic wave (e.g., SAW) generation or detection, or both, e.g., can be mounted at a location removed from the build zone, and the acoustic wave can be coupled between the material and the piezoelectric device(s).

While various illustrative embodiments of the invention are described above, it will be apparent to one skilled in the art that various changes and modifications can be made therein without departing from the invention. The appended claims are intended to cover all such changes and modifications that fall within the true spirit and scope of the invention.

What is claimed:

1. A method of processing a material, the method comprising:
heating a first region of the material with a first energy source;
exciting a first acoustic wave in the material;
transmitting the first acoustic wave through the heated first region of the material, the heated first region of the material changing at least one property of the first acoustic wave;
detecting the change in at least one property of the first acoustic wave;
characterizing a temperature of the material in the heated first region based on the detected change in at least one property of the first acoustic wave;
comparing the characterized temperature of the material in the heated first region to a threshold; and
based on the characterized temperature of the material in the first region being less than the threshold or being above the threshold for an insufficient amount of time, modifying a property of the heated first region with a second energy source.

2. The method of claim 1, further comprising, responsive to heating the first region of the material with the first energy source, melting a powder or a wire in the first region to form the material.

3. The method of claim 1, further comprising, responsive to heating the first region of the material with the first energy source, excising a portion of the material.

4. The method of claim 1, wherein the acoustic wave comprises one or more of a surface acoustic wave, a bulk acoustic wave, a guided acoustic wave, and a phonon.

5. The method of claim 1, further comprising:
characterizing a defect in a morphology of the material in the heated first region based on the detected change in at least one property of the first acoustic wave; and
based on the characterized defect, heating the first region of the material to a temperature above the threshold with the second energy source.

6. The method of claim 1, wherein modifying the property of the heated first region with the second energy source comprises heating the first region of the material to a temperature above the threshold.

7. The method of claim 1, further comprising:
exciting a second acoustic wave in the material;
transmitting the second acoustic wave through a heated second region of the material, the heated second region of the material changing at least one property of the second acoustic wave;
detecting the change in at least one property of the second acoustic wave;
characterizing a temperature of the material in the heated second region based on the detected change in at least one property of the second acoustic wave;
comparing the characterized temperature of the material in the heated second region to a threshold; and
based on the characterized temperature of the material in the second region being less than the threshold or being above the threshold for an insufficient amount of time, modifying a property of the heated second region with the second energy source or with a third energy source.

8. The method of claim 1, wherein the change in at least one property of the first acoustic wave comprises a change in an arrival time, a change in a disturbance amplitude, or changes both in the arrival time and the disturbance amplitude, of at least one frequency component of the first acoustic wave.

9. The method of claim 8, wherein detecting the change in the arrival time, the change in the disturbance amplitude, or the changes both in the arrival time and the disturbance amplitude, of the at least one frequency component of the first acoustic wave comprises receiving laser light reflected from the material.

10. The method of claim 1, wherein the first energy source comprises a first laser or a first particle beam.

11. The method of claim 10, wherein the first laser excites the first acoustic wave.

12. The method of claim 10, wherein the second energy source comprises a second laser or a second particle beam that is discrete from the first laser or the first particle beam.

* * * * *